United States Patent
Kato et al.

(10) Patent No.: US 10,043,842 B2
(45) Date of Patent: Aug. 7, 2018

(54) IMAGING DEVICE AND METHOD OF PRODUCING THE SAME

(71) Applicant: CANON KABUSHIKI KAISHA, Tokyo (JP)

(72) Inventors: Aiko Kato, Machida (JP); Shingo Kitamura, Fujisawa (JP); Takehiro Toyoda, Machida (JP); Hiroaki Naruse, Oita (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 22 days.

(21) Appl. No.: 14/506,416

(22) Filed: Oct. 3, 2014

(65) Prior Publication Data

US 2015/0097998 A1   Apr. 9, 2015

(30) Foreign Application Priority Data

Oct. 9, 2013   (JP) ................... 2013-212290

(51) Int. Cl.
*H01L 27/146* (2006.01)

(52) U.S. Cl.
CPC .. *H01L 27/14636* (2013.01); *H01L 27/14603* (2013.01); *H01L 27/14623* (2013.01); *H01L 27/14627* (2013.01); *H01L 27/14629* (2013.01)

(58) Field of Classification Search
CPC .............................. H01L 27/14636
USPC .................................. 257/258
See application file for complete search history.

(56) References Cited

U.S. PATENT DOCUMENTS

| | | | | |
|---|---|---|---|---|
| 8,508,010 B2* | 8/2013 | Maruyama | ........ | H01L 27/14623 257/435 |
| 2006/0220025 A1* | 10/2006 | Oh | ................... | H01L 27/14609 257/72 |
| 2012/0012961 A1* | 1/2012 | Kataoka | ............ | H01L 27/14621 257/432 |
| 2012/0199927 A1* | 8/2012 | Shimotsusa | ....... | H01L 27/14623 257/432 |

FOREIGN PATENT DOCUMENTS

| | | |
|---|---|---|
| JP | 2001-230400 A | 8/2001 |
| JP | 2009-164247 A | 7/2009 |
| JP | 2013-084740 A | 5/2013 |

\* cited by examiner

*Primary Examiner* — Cheung Lee
(74) *Attorney, Agent, or Firm* — Canon U.S.A., Inc. IP Division

(57) ABSTRACT

An imaging device includes a pixel circuit region that includes a plurality of pixel circuits arranged in an array therein and a plurality of light guide portions. The imaging device also includes a peripheral circuit region that is positioned at a periphery of the pixel circuit region and includes a peripheral circuit. The imaging device also includes an intermediate region that is positioned between the pixel circuit region and the peripheral circuit region, forms a boundary with the pixel circuit region and the peripheral circuit region, and includes a plurality of dummy light guide portions and a plurality of contacts through which a reference potential of the plurality of pixel circuits is supplied.

20 Claims, 11 Drawing Sheets

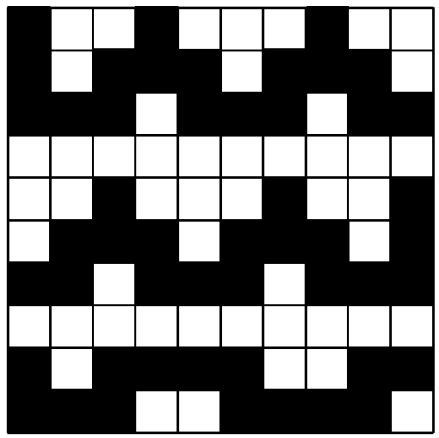
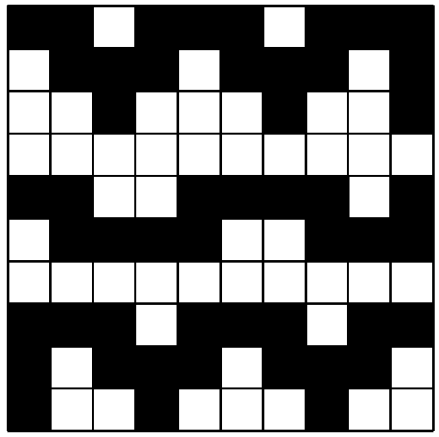
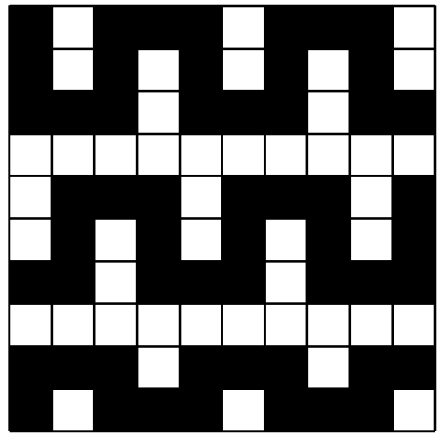

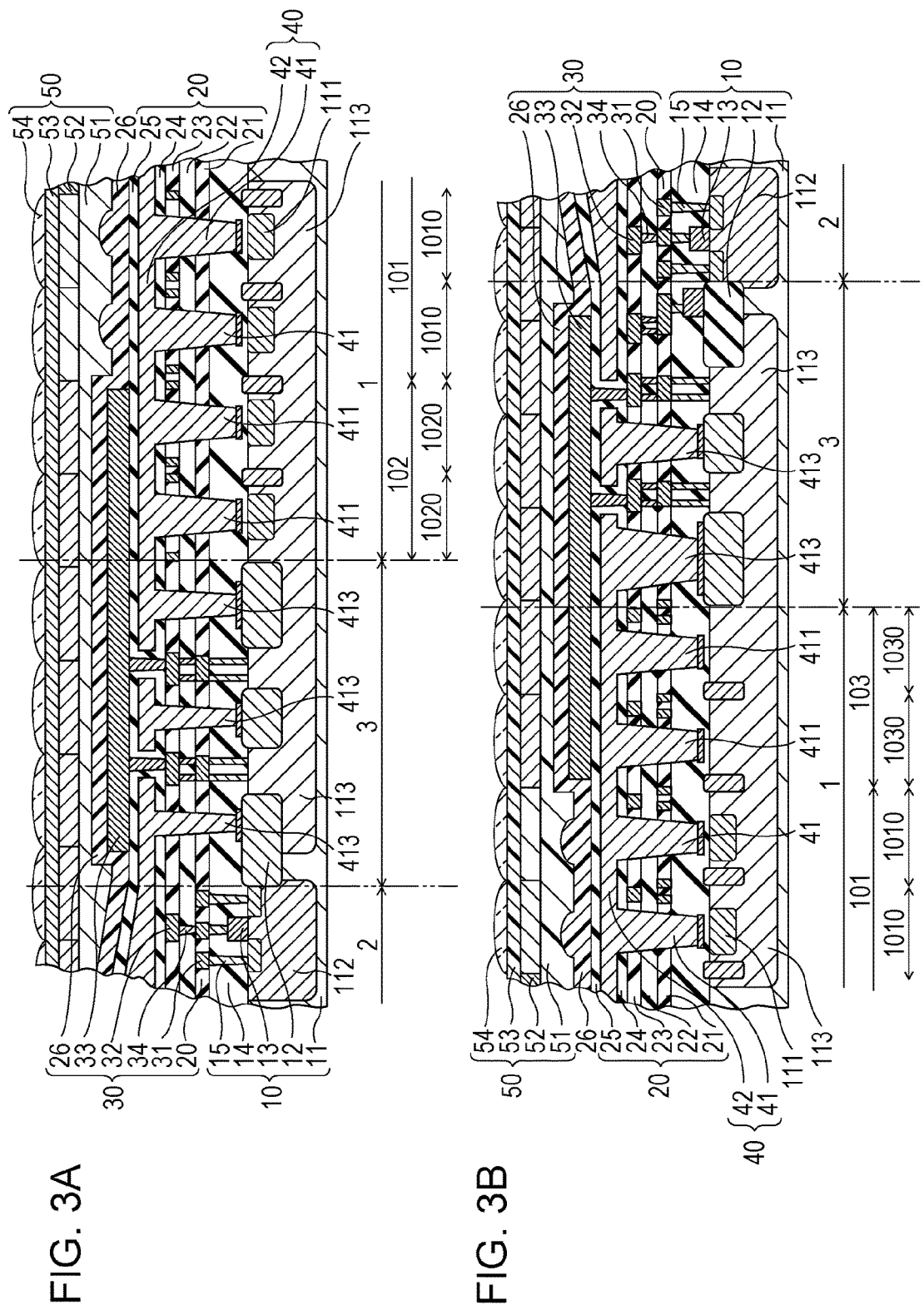

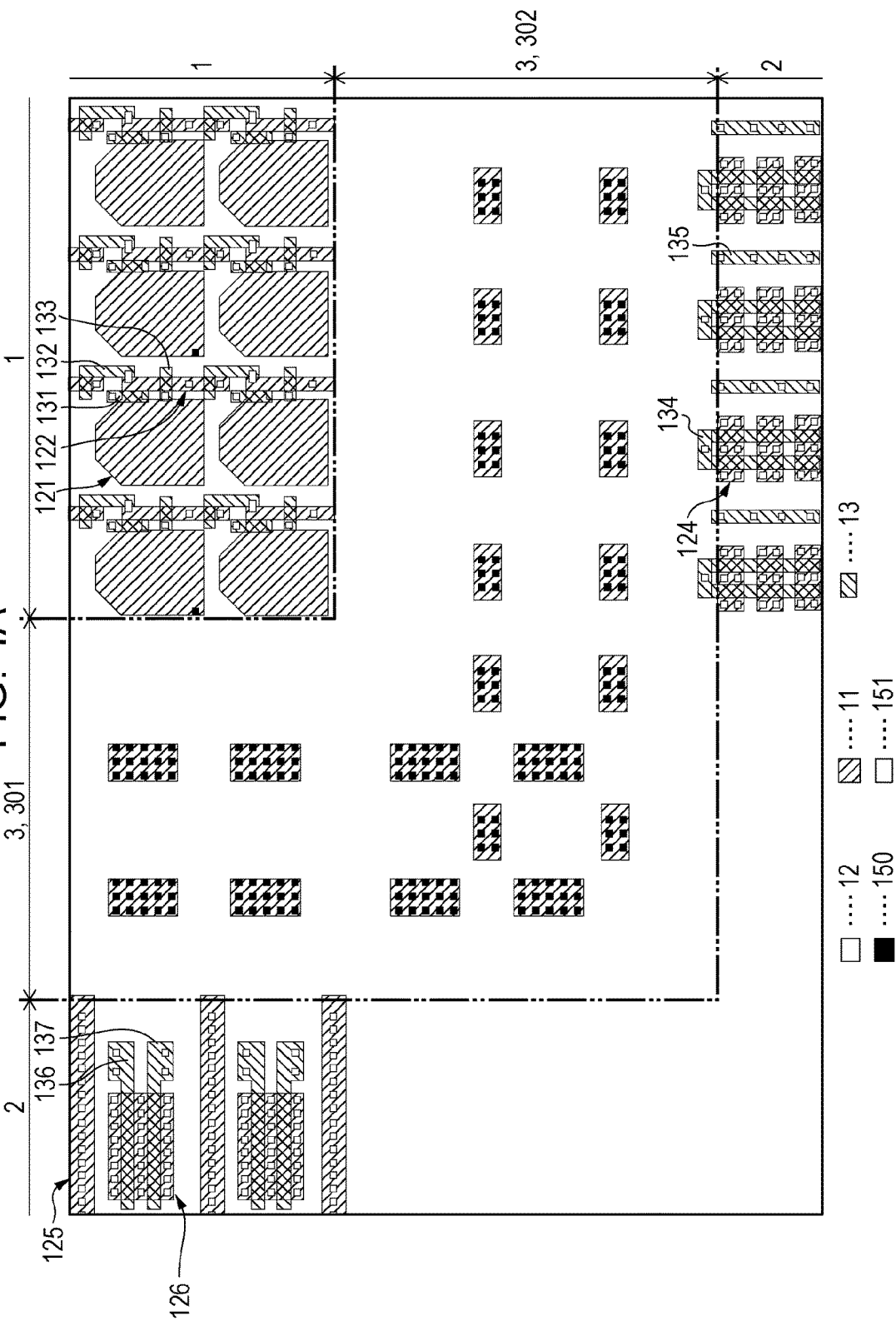

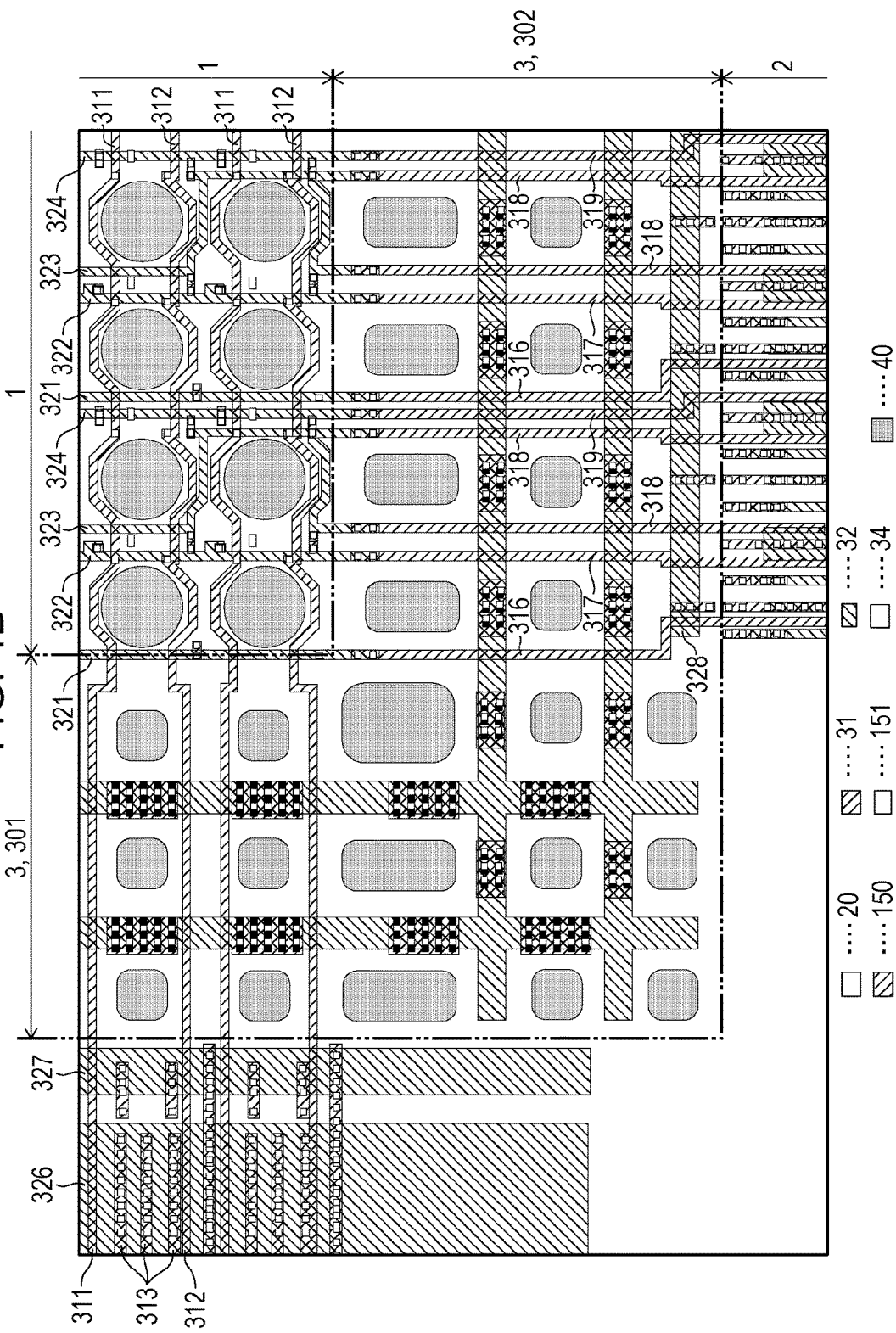

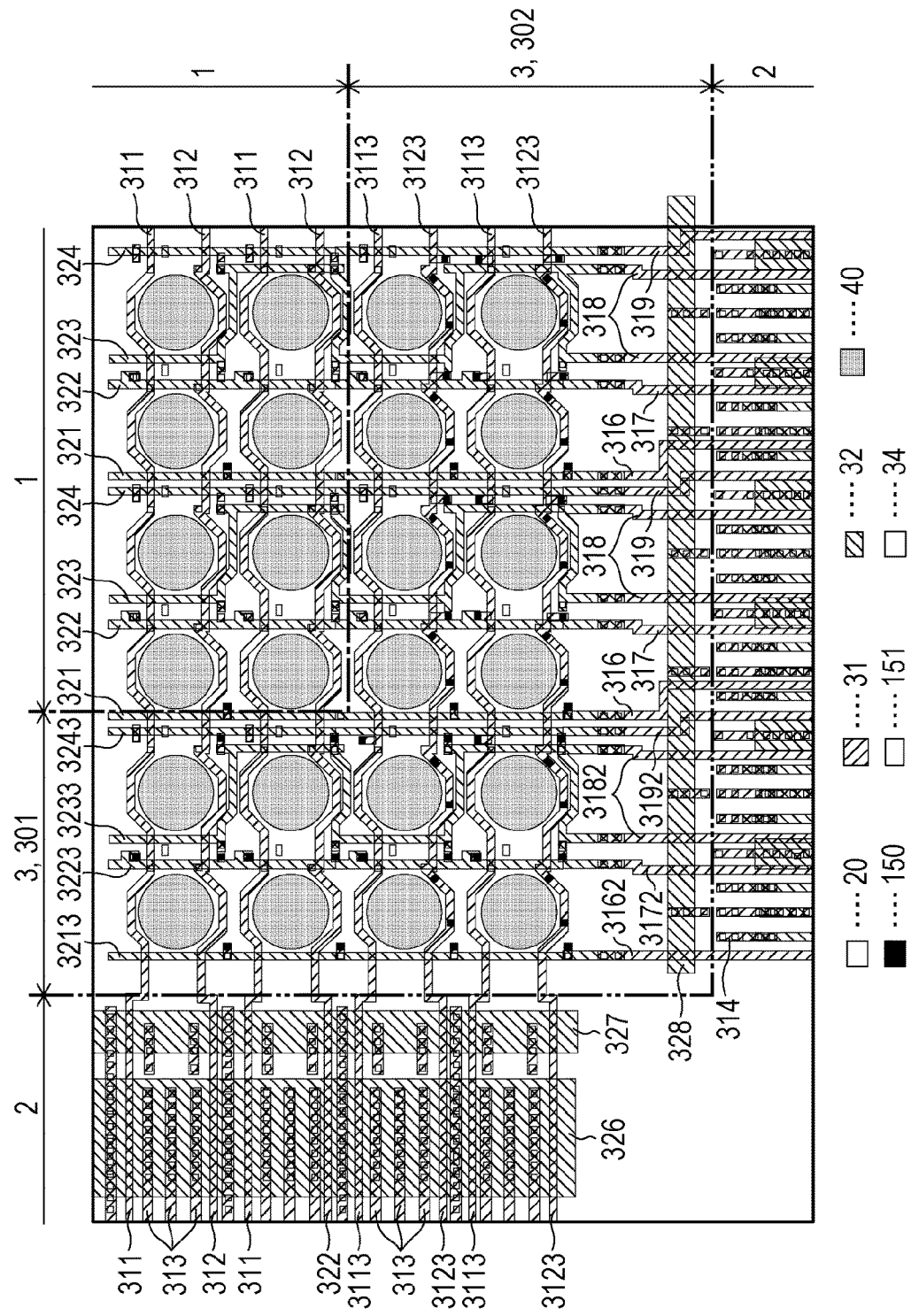

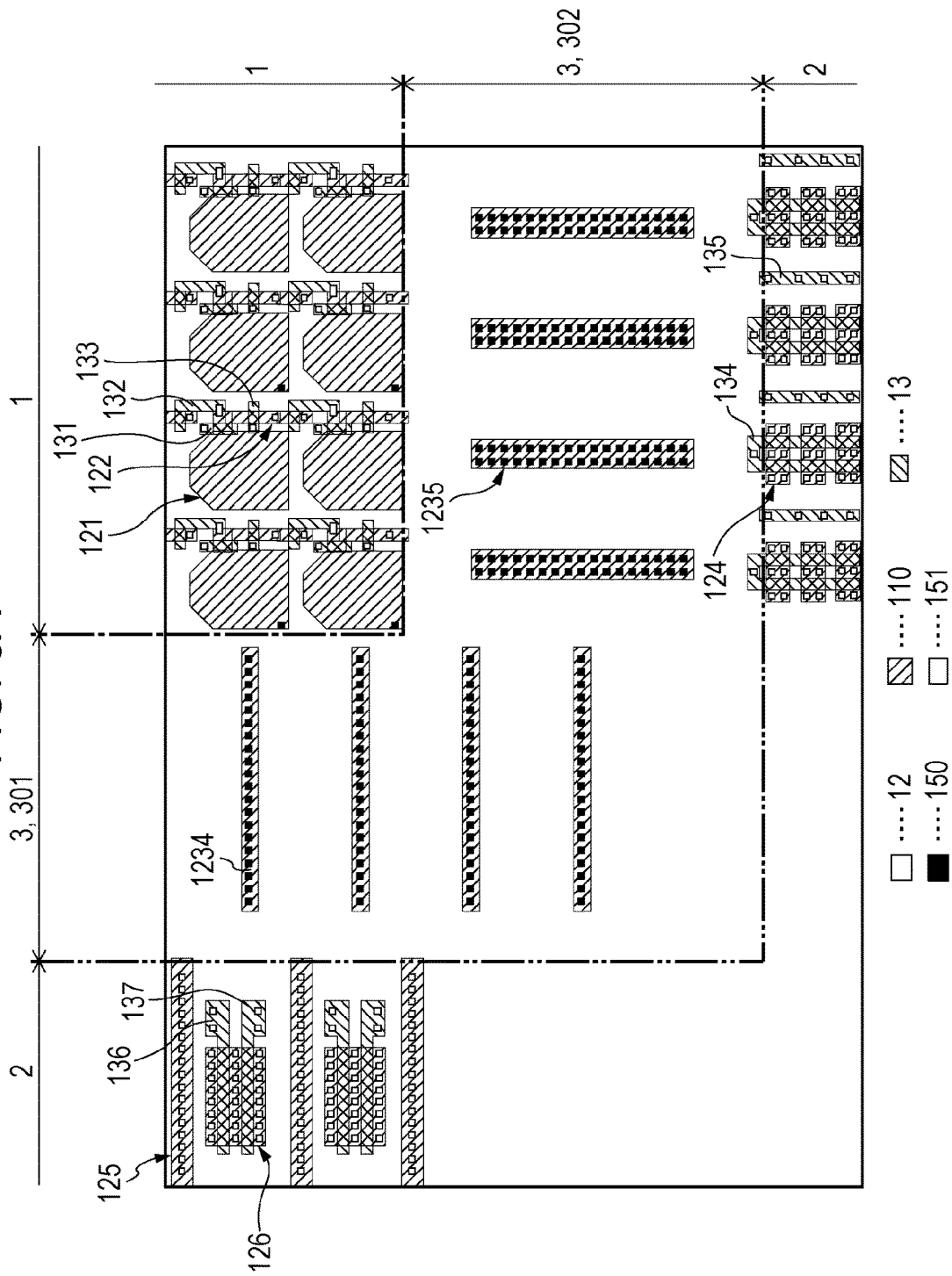

IMAGING DEVICE AND METHOD OF PRODUCING THE SAME

BACKGROUND OF THE INVENTION

Field of the Invention

The present invention relates to an imaging device.

Description of the Related Art

Imaging devices such as complementary metal oxide semiconductor (CMOS) image sensors include a pixel circuit region, in which pixel circuits are disposed, and a peripheral circuit region, in which peripheral circuits are disposed. In the pixel circuit region, the sensitivity can be improved with light guide portions serving as optical waveguides provided on photoelectric conversion portions.

These light guide portions can be formed as follows: Initially, holes are formed in portions of an insulating layer provided in the pixel circuit region at positions above the photoelectric conversion portions. Next, the holes are filled with a dielectric material. In addition, the surface of the excess dielectric material remaining outside the holes is subjected to a planarization process so that the excess dielectric material is removed. Members formed of the dielectric material remaining in the holes (dielectric members) serve as the light guide portions.

When the holes have been filled with the dielectric material, in the peripheral circuit region where the holes are not formed, the dielectric material with which the holes are not filled remains on the insulating film. Thus, the level of the surface of the dielectric material varies between the peripheral circuit region and the pixel circuit region. Furthermore, when the planarization process is performed on the dielectric material, the level of the dielectric material varies between a central portion and a peripheral portion of the pixel circuit region. The variation of the level of the surface of the dielectric members between the central portion and the peripheral portion of the pixel circuit region leads to variation of signal output between the central portion and the peripheral portion of the pixel circuit region. This causes degradation of the quality of images.

A technique, in which a dummy opening portion is provided in an insulating layer in a region at the periphery of an effective pixel region, is described in Japanese Patent Laid-Open No. 2009-164247. Examples of the region at the periphery of the effective pixel region include an optical black region and a peripheral circuit region.

The difference in the film thickness produced at a boundary region between the effective pixel circuit region and its peripheral circuit region is not sufficiently reduced only with the dummy opening portion provided in the optical black region. Furthermore, since transistors and wiring are densely disposed in a peripheral circuit region, an area in which the dummy opening portion can be formed is limited.

SUMMARY OF THE INVENTION

According to a first aspect of the present technology, an imaging device includes a pixel circuit region that includes a plurality of pixel circuits arranged in an array therein and a plurality of light guide portions. The imaging device also includes a peripheral circuit region that is positioned at a periphery of the pixel circuit region and includes a peripheral circuit. The imaging device also includes an intermediate region that is positioned between the pixel circuit region and the peripheral circuit region, forms a boundary with the pixel circuit region and the peripheral circuit region, and includes a plurality of dummy light guide portions and a plurality of contacts through which a reference potential of the plurality of pixel circuits is supplied.

According to a second aspect of the present technology, an imaging device includes a pixel circuit region including a plurality of pixel circuits arranged in an array therein. The imaging device also includes a peripheral circuit region that is positioned at a periphery of the pixel circuit region and includes a peripheral circuit. The imaging device also includes an intermediate region that is positioned between the pixel circuit region and the peripheral circuit region, forms a boundary with the pixel circuit region and the peripheral circuit region, and includes a plurality of contacts through which a reference potential of the plurality of pixel circuits is supplied. In the imaging device, a semiconductor layer and an insulation layer positioned on the semiconductor layer are disposed in the pixel circuit region, the peripheral circuit region and the intermediate region, and a plurality of dielectric members that extend through the insulating layer are disposed in the pixel circuit region and the intermediate region.

According to a third aspect of the present technology, a method of producing an imaging device includes providing (1) a pixel circuit region that includes a plurality of pixel circuits arranged in an array, (2) a peripheral circuit region, which includes a peripheral circuit, at a periphery of the pixel circuit region, and (3) an intermediate region, which forms a boundary with the pixel circuit region and the peripheral circuit region, between the pixel circuit region and the peripheral circuit region. In the method, a semiconductor layer and an insulating layer positioned on the semiconductor layer are provided in the pixel circuit region, the peripheral circuit region, and the intermediate region. In the method, a plurality of contacts, through which a reference potential of the plurality of pixel circuits is supplied, is provided in the intermediate region, a hole that penetrates through the insulating layer is formed in each of the pixel circuit region and the intermediate region, and the holes are filled with a dielectric material.

Further features of the present invention will become apparent from the following description of exemplary embodiments with reference to the attached drawings.

BRIEF DESCRIPTION OF THE DRAWINGS

FIGS. 2A, 2B1, 2B2, 2C1 and 2C2 are schematic diagrams illustrating an occupancy rate and a coincidence rate.

FIGS. 3A and 3B are schematic sectional views of an example of the imaging device.

FIGS. 4A and 4B are schematic plan views of the example of the imaging device.

FIGS. 6A and 6B are schematic plan views of the example of the imaging device.

FIGS. 8A and 8B are schematic plan views of the example of the imaging device.

DESCRIPTION OF THE EMBODIMENTS

Embodiments of the present invention will be described below with reference to the drawings. In the following description and the drawings, a plurality of drawings may be referred to one another. Elements common to the plurality of drawings are denoted by common reference signs, and description of the elements denoted by the common reference signs may be appropriately omitted.

Figure 1:
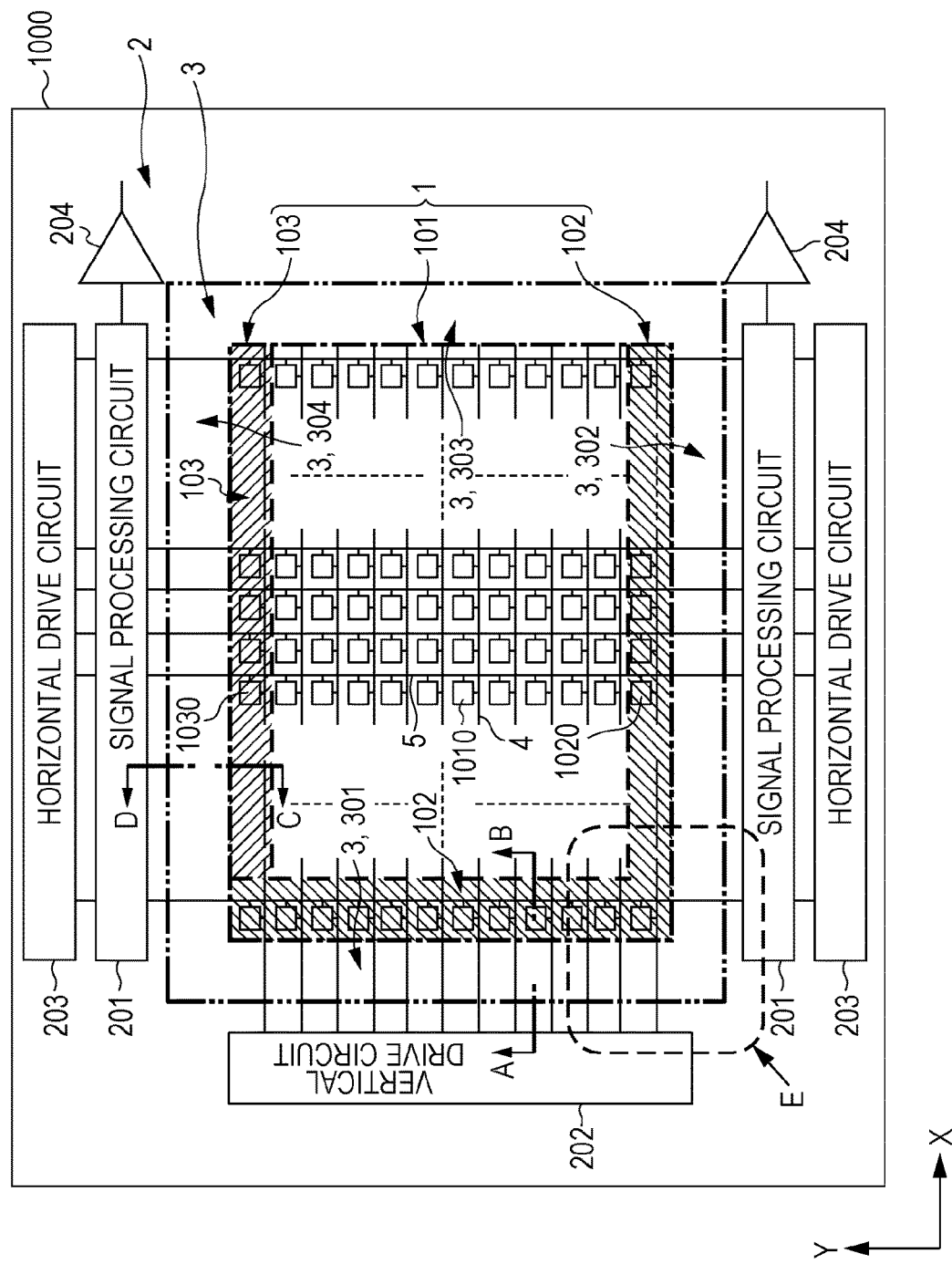
FIG. 1 is a block plan view of an example of an imaging device.

FIG. 1 is a block plan view of an imaging device 1000. The imaging device 1000 includes a pixel circuit region 1 and a peripheral circuit region 2. Pixel circuits are disposed in the pixel circuit region 1. Peripheral circuits are disposed in the peripheral circuit region 2. The peripheral circuit region 2 is disposed around the pixel circuit region 1. In the present embodiment, the peripheral circuit region 2 is separated from the pixel circuit region 1 with an intermediate region 3 interposed therebetween. In FIG. 1, the pixel circuit region 1 is surrounded by dot-dash lines, the peripheral circuit region 2 is positioned between dot-dot-dash lines and solid lines, and the intermediate region 3 is positioned between the dot-dash lines and the dot-dot-dash lines. The intermediate region 3 is disposed on the peripheral circuit region 2 side relative to the edges of the pixel circuit region 1. Inner ends of the intermediate region 3 form a boundary (corresponding to the dot-dash lines in FIG. 1) with the edges of the pixel circuit region 1. Also, the intermediate region 3 is disposed on the pixel circuit region 1 side relative to the edges (inner edges) of the peripheral circuit region 2. Outer ends of the intermediate region 3 form a boundary (corresponding to the dot-dot-dash lines in FIG. 1) with the peripheral circuit region 2. The dot-dash lines and the dot-dot-dash lines that represent boundaries are also illustrated in some of the other drawings. The edges of the pixel circuit region 1 include edges of active regions of semiconductor elements included in the pixel circuits of the pixel circuit region 1. The edges of the peripheral circuit region 2 include edges of active regions of semiconductor elements included in the peripheral circuits of the peripheral circuit region 2. The inner ends of the intermediate region 3 include edges of an element isolation region adjacent to the active regions of the semiconductor elements included in the pixel circuits of the pixel circuit region 1. The outer ends of the intermediate region 3 include edges of an element isolation region adjacent to the active regions of the semiconductor elements included in the peripheral circuits of the peripheral circuit region 2. The range of the intermediate region 3 will be described in detail later.

The pixel circuits arranged in an array in the pixel circuit region 1 each include a photoelectric conversion portion and a signal generating portion that generate electrical signals. Pixels include the respective photoelectric conversion portions. The signal generating portions of the pixel circuits include components such as transfer gates, floating nodes, amplifying transistors, and reset transistors. The signal generating portion may alternatively be shared among a plurality of the pixels. A plurality of the pixel circuits are arranged in rows and columns in the pixel circuit region 1. The pixel circuit region 1 also includes wiring (global wiring) that connects the signal generating portions of the plurality of pixel circuits to one another in each raw or column. In FIG. 1, as the global wiring, row wiring lines that extend in a row direction and column wiring lines that extend in a column direction are illustrated. The row direction refers to a direction in which the pixels belonging to a single row is arranged. The plurality of columns are arranged in the row direction. The column direction refers to a direction in which the pixels belonging to a single column is arranged. The plurality of rows are arranged in the column direction. In FIG. 1, the row direction extends in the horizontal direction and the column direction extends in the vertical direction.

The pixel circuit region 1 at least includes a light receiving pixel region 101. Light receiving pixels 1010 are arranged in the light receiving pixel region 101. The light receiving pixels 1010 include the photoelectric conversion portions, which can receive light, and the signal generating portions, which generate signals in accordance with charges of the photoelectric conversion portions. The signals generated by the signal generating portions of the light receiving pixels 1010 form an image. In addition to the light receiving pixel region 101, the pixel circuit region 1 includes at least one of a first reference pixel region 102 and a second reference pixel region 103. First reference pixels 1020 are arranged in the first reference pixel region 102. The first reference pixels 1020 include photoelectric conversion portions, which are shielded from light, and signal generating portions, which generate signals in accordance with charges of the photoelectric conversion portions. The second reference pixels 1030 are arranged in the second reference pixel region 103. The second reference pixels 1030 include signal generating portions and do not include photoelectric conversion portions. The signals generated by the signal generating portions of the first reference pixels 1020 or the second reference pixels 1030 are used as reference signals for the purposes such as reduction of noise of signals obtained in the light receiving pixels 1010. The light receiving pixels 1010 directly form an image. The signals output from the reference pixels 1020 and 1030 indirectly form an image. The light receiving pixel region 101 can be referred to as an effective pixel region, and the light receiving pixels 1010 can be referred to as effective pixels. The first reference pixel region 102 and the second reference pixel region 103 can be referred to as non-effective pixel regions and the first reference pixels 1020 and the Second reference pixels 1030 can be referred to as non-effective pixels.

The Peripheral circuits disposed in the peripheral circuit region 2 include signal processing circuits 201, a drive circuit 202 (vertical drive circuit), drive circuits 203 (horizontal drive circuits), and output circuits 204. The signal processing circuits 201 process the signals from the pixel circuits. The drive circuit 202 drives the pixel circuits. The drive circuits 203 drive signal processing circuits 201.

The signal processing circuits 201 can include reading circuits that include components such as constant current sources, correlated double sampling (CDS) circuits, analog-to-digital converter (ADC) circuits, amplification circuits, and so forth. The peripheral circuits can also include digital signal processing circuits that process digital signals generated by the ADC circuits.

The intermediate region 3 includes, for example, wiring lines that connect, for example, the pixel circuits to the peripheral circuits. The intermediate region 3 also includes, for example, dummy members, which are not included in either the pixel circuits or the peripheral circuits. The intermediate region 3 also includes, for example, conductive members (contact plugs), through which a reference potential is applied to, for example, the pixel circuits.

As described above, the first reference pixels 1020 and the second reference pixels 1030 are included in the pixel circuit region 1. The light receiving pixels 1010, the first reference pixels 1020, and the second reference pixels 1030 do not exist in the intermediate region 3. As described later, structures similar to the effective pixels or the non-effective pixels, which are the pixels disposed in the pixel circuit region 1, can be provided in the intermediate region 3. However, those similar structures do not form pixels and do not output signals for directly or indirectly forming an image. Furthermore, even when the similar structures are actually operable as active elements, the active elements do not output signals for directly or indirectly forming an image. In other words, there is no active element that outputs signals for directly or indirectly forming an image in the intermediate region 3.

In FIG. 1, the intermediate region 3 includes a left region 301 formed between the first reference pixel region 102 and the vertical drive circuit 202, a lower region 302 formed between the first reference pixel region 102 and one of the signal processing circuits 201, an upper region 304 formed between the second reference pixel region 103 and the other signal processing circuits 201, and a right region 303 opposite to the vertical drive circuit 202 with respect to the light receiving pixel region 101. Thus, the intermediate region 3 surrounds the pixel circuit region 1 with the left, lower, upper, and right regions 301 to 304 thereof, each being on a corresponding one of four sides of the pixel circuit region 1.

The imaging device 1000 is a layered structure formed of a plurality of layers that include semiconductor layer, insulating layers, electrically conductive layers, and so forth. These layers are provided in the pixel circuit region 1, the peripheral circuit region 2, and the intermediate region 3. In the present embodiment, a certain layer out of these layers (may alternatively be referred to as a specific layer hereafter) and a member that extends through any of these layers (may alternatively be referred to as a specific member hereafter) is focused, and layout of the specific layer and the specific member are discussed. Specific examples of the layers, the specific layer, and the specific member included in the imaging device 1000 will be described later.

The intermediate region 3 can be used as a region that adjusts the difference in the distribution (density) of the specific layer and the specific member when those of the pixel circuit region 1 and those of the peripheral circuit region 2 are compared with one another. Specifically, when the specific layer disposed in the pixel circuit region 1 are also disposed in the intermediate region 3, the density of the specific layer in the intermediate region 3 is caused to approach the density of the specific layers disposed in the pixel circuit region 1. Hereafter, certain regions of the pixel circuit region 1, the peripheral circuit region 2, and the intermediate region 3 are referred to as specific regions. Although description hereafter is devoted to the specific member, the description is similarly applicable to the specific layer.

Here, the distribution, that is, the density of the specific member can be defined by an "occupancy rate" of the specific member. The occupancy rate of the specific member in the specific region is expressed as a percentage obtained by dividing the occupation area of the specific member in the specific region by the total area of the specific region. That is, the occupancy rate referred to herein is an area occupancy rate. The total area of the specific region is the area occupied by the specific regions in a virtual plane parallel to the surface of a semiconductor layer, by which light receiving surfaces of the photoelectric conversion portions are formed, and positioned at the same level as the level of the specific member. The occupation area of the specific member is an area where the specific member exists in the specific region. The occupation area of the specific member corresponds to an area of an orthogonal projection of the specific member on the semiconductor layer. The area of the specific region is the sum of the occupation area of the specific member and the occupation area of the layer other than the specific member (non-specific member), the layer being positioned at the same level as the level of the specific member. The specific member extends through the layer (non-specific member) other than the specific member, the layer being positioned at the same level as the level of the specific member. The non-specific member is not limited to a single layer and may be a plurality of types of layers.

The occupation area of the specific member can be obtained by using, for example, the following technique.

Initially, a square grid coordinate system is applied to the virtual plane where the specific member is positioned. The presence and absence of the specific member in cells corresponding to the coordinates are binarized and assigned to the coordinates. It is sufficient that the pitch of the square grid coordinates be about a half the minimum width of the pattern of the specific member. As the binarization technique, a threshold method can be used. In this method, for example, it is sufficient that the presence or absence of the specific member be determined, for example, as follows: that is, in each of the cells, when more than half the area of the cell is occupied by the specific member, the specific member is present in this cell; and otherwise, the specific member is not present in this cell. As the binarization technique, an error diffusion method or an ordered dithering method can be used.

An example illustrated in FIG. 2A represents the result of the binarization performed in the pixel circuit region 1 as follows: a region in the virtual plane where the specific member is positioned is divided into 10-by-10 cells, that is, 100 cells, and the presence or absence of the specific member is binarized in each of the cells. The specific member in the example illustrated in FIG. 2A is a pattern formed of three continuous lines, which each meander, represented by filled cells. Blank cells mean the presence of the non-specific member. Likewise, examples illustrated in FIGS. 2B1 and 2B2 represent the results of the binarization each performed in the intermediate region 3 as follows: a region in the virtual plane where the specific member is positioned is divided into 10-by-10 cells, that is, 100 cells, and the presence or absence of the specific member is binarized in each of the cells. By separating the entirety of the specific region into such cells and binarizing the resultant cells, the occupancy rate of the specific member in the specific region can be calculated. The pattern illustrated in FIG. 2B1 is, for example, a pattern of the specific member in part of the lower region 302 of the intermediate region 3. The pattern illustrated in FIG. 2B2 is a pattern of the specific member in another part of the intermediate region 3, for example, the pattern in part of the upper region 304 of the intermediate region 3.

The occupancy rate of the specific member in the pixel circuit region 1 is, as can be understood from FIG. 2A, 53%. The occupancy rate of the specific member in the intermediate region 3 is, as can be understood from the patterns in FIGS. 2B1 and 2B2, 52%. Thus, the occupancy rate of the specific member in the intermediate region 3 is 0.98 times the occupancy rate of the specific member in the pixel circuit region 1.

The occupancy rate of the specific member in the intermediate region 3 may be from 0.5 to 1.5 times the occupancy rate of the specific member in the pixel circuit region 1. In this state, it can be said that the density of the specific member in the intermediate region 3 is similar to the density of the specific member in the pixel circuit region 1. The occupancy rate of the specific member in the intermediate region 3 may be from 0.7 to 1.3 times the occupancy rate of the specific member in the pixel circuit region 1. In this state, it can be said that the density of the specific member in the intermediate region 3 is highly similar to the density of the specific member in the pixel circuit region 1. Furthermore, the occupancy rate of the specific member in the intermediate region 3 may be from 0.9 to 1.1 times the occupancy rate of the specific member in the pixel circuit region 1. In this state, it can be said that the density of the specific member in the intermediate region 3 is even more highly similar to the density of the specific member in the pixel circuit region 1. When the occupancy rate of the specific member in the intermediate region 3 is 1.0 times the occupancy rate of the specific member in the pixel circuit region 1, it can be said that the density of the specific member in the intermediate region 3 coincides with the density of the specific member in the pixel circuit region 1.

In order to set the occupancy rate of the specific member in the intermediate region 3 to a value from 0.5 to 1.5 times the occupancy rate of the specific member in the pixel circuit region 1 as described above, the planar layout of the specific member can be an arbitrary shape (pattern). Despite this, the planar layout of the specific member in the pixel circuit region 1 can be similar to that in the intermediate region 3. This can improve the flatness of the non-specific member positioned in a layer on the specific member or at the same level as the level of the specific member in the pixel circuit region 1. The degree of similarity of the planar layouts of the specific member can be defined as a "coincidence rate" of patterns. How to calculate the coincidence rate is described below.

Initially, in two specific regions for which the coincidence rate is calculated, the square grid coordinate system is applied to respective appropriate sections in a virtual plane at the same level as that of the specific member and each of the sections are separated into a plurality of the cells. Outlines of the sections applied to the respective specific regions are to be congruent to each other. The presence or absence of the specific member in each of the cells is assigned to a corresponding one of the coordinates by binarizing the value of the area of the specific member in the cell. This technique is similar to the above-described calculation of the occupancy rate, and accordingly, description thereof is omitted.

Next, the pattern of the specific member in the pixel circuit region 1 and the pattern of the specific member in the intermediate region 3 are superposed with each other, and whether or not the pattern in each of the cells (coordinates) in one of the sections is superposed with the pattern in a corresponding one of the cells (coordinates) at a relatively equal position in the other section is determined from cell to cell. Among all the cells, the number of cells in which the specific member exists in both the pixel circuit region 1 and the intermediate region 3 ($N_O$) is counted. The number of cells in which the specific member exists in neither the pixel circuit region 1 nor the intermediate region 3 ($N_X$) is also counted. The coincidence rate is expressed as a percentage of a value obtained by dividing the sum of these numbers ($N_O+N_X$) by the number of total cells ($N_T$) and given as follows: $(100 \times (N_O+N_X)/N_T)$ %. The number of cells in which the specific member exists region 3 is calculated as follows: $N_T-N_O-N_X$.

Two sections to be compared for calculating the coincidence rate of the patters of the specific member is selected so as to maximize the coincidence rate of the patterns of the specific member in two sections to be compared. For example, the sections are selected as follows: Initially, a section in one of two specific regions to be compared (first section) is selected. Next, from the other of the two specific regions to be compared, a section (second section), the coincidence rate of which to the pattern of the specific member in the first section is the highest, is selected. Typically, the second section, the coincidence rate of which to the first section is the highest, exists at or near a position that is a translated position of the first section in the row direction or the column direction.

FIG. 2C1 visually represents the degree of similarity of the combination of the patterns in FIGS. 2A and 2B1, and FIG. 2C2 visually represents the degree of similarity of the combination of the patterns in FIGS. 2A and 2B2. The cells in which the specific member exists in both the pixel circuit region 1 and the intermediate region 3 are indicated by "O"s. The cells in which the specific member exists in neither the pixel circuit region 1 nor the intermediate region 3 are indicated by "X"s. The cells in which the specific member exists in the pixel circuit region 1 and does not exist in the intermediate region 3 are indicated by "A"s.

The cells in which the specific member does not exist in the pixel circuit region 1 and exists in the intermediate region 3 are indicated by "B"s. As described above, it can be understood that as the numbers of "O"s and "X"s increase, the coincidence rate increases, and accordingly, the degree of similarity increases. In FIG. 2C1, Os are indicated in 27 cells, Xs are indicated in 22 cells, As are indicated in 28 cells, and Bs are indicated in 23 cells. Thus, the coincidence rate is 49%. In FIG. 2C2, Os are indicated in 43 cells, Xs indicated in 28 cells, As are indicated in 12 cells, and Bs are indicated in 7 cells. Thus, the coincidence rate is 91%.

As the coincidence rate of the patterns of the specific member in the pixel circuit region 1 and the intermediate region 3 increases, the coincidence rate may become desirable. When the coincidence rate is equal to or more than 50%, it can be said that the patterns are similar to each other, and when the coincidence rate is equal to or more than 70%, it can be said that the patterns are highly similar to each other. Furthermore, when the coincidence rate is equal to or more than 90%, it can be said that the patterns are even more highly similar to each other, and when the coincidence rate is 100%, it can be said that the patterns coincide with each other. When the patterns of the specific member are similar to each other between the pixel circuit region 1 and the intermediate region 3, this means that occupancy rates of the specific member in the pixel circuit region 1 and the intermediate region 3 are likely to be highly similar to each other. In contrast, as can be understood from the comparison of FIG. 2A with FIG. 2B1 and the comparison of FIG. 2A with FIG. 2B2, even when the occupancy rates of the specific member between the pixel circuit region 1 and the intermediate region 3 are similar to each other, this does not necessarily mean that the patterns of the specific member are similar to each other. Furthermore, the geometrical similarity of the patterns between the pixel circuit region 1 and the intermediate region 3 does not directly lead to an increase in the occupancy rate and the coincidence rate.

The above-described techniques for calculating the occupancy rate and the coincidence rate are exemplary. Actually, the occupancy rate and the coincidence rate can be easily calculated by a computer aided design (CAD) system for designing photo masks, which is used during the production of the imaging device. The occupancy rate and the coincidence rate can also be calculated by a method such as an image analysis.

The width of the intermediate region 3, that is, the distance between the pixel circuit region 1 and the peripheral circuit region 2 in the column direction or the row direction is from 1 µm to 1000 µm. When this distance is excessively small, the effects produced by the specific member provided in the intermediate region 3 are reduced. When the distance is excessively large, the size of the imaging device 1000 is unnecessarily increased. The width of the intermediate region 3 may be from 10 µm to 100 µm. The width of the intermediate region 3 in the column direction can be at least double the pitch of the rows of the pixels arranged in the pixel circuit region 1, that is, equal to or larger than two rows of the pixels. The typical pitch of the arranged pixels is from 0.5 µm to 5 µm. The width of the intermediate region 3 in the row direction can be at least a plurality of times the pitch of the columns of the arranged pixels in the pixel circuit region 1, that is, equal to or larger than the width of two columns of the pixels. For example, the width of the intermediate region 3 can be from the width of ten columns to the width of a hundred columns.

In the pixel circuit region 1, the above-described section in the specific region for which the coincidence rate is calculated may be set to be an area that contains a single pixel circuit. Moreover, the section may be equal to or larger than a minimum unit of a repetitive pattern. This minimum unit corresponds to, for example, the layout of a single pixel. When a structure shared by the pixels is used, the minimum unit corresponds to the layout of a plurality of the pixels. Here, the outlines of the sections of the respective regions to be compared need to be congruent to each other. A correct coincidence rate cannot be calculated when the outline of the section of one of the regions is quadrangular and the outline of the section of the other region is circular. Furthermore, the width of the section in the pixel circuit region 1 for the calculation of the coincidence rate does not exceed the width of the intermediate region 3. For example, with reference to the width of the intermediate region 3, the section in the pixel circuit region 1 is set in an area smaller than a square section, the width of the four sides of which is equal to the width of the intermediate region 3. That is, it is sufficient that, when the width of the intermediate region 3 is W, a section of a length W and a width W or smaller be divided into an appropriate number of cells and the coincidence be determined cell by cell. For example, when the width of the intermediate region 3 is 60 µm, and the width of the pattern of the specific member is 100 nm. In this case, it is sufficient that a 50 nm square cell be defined, a 50 µm square section be divided into 1000000 cells, that is, 1000 cells in the length direction and 1000 cells in the width direction, and this section be applied to the pixel circuit region 1 and the intermediate region 3 so as to calculate the coincidence rate. The sections having similar patterns as those in the pixel circuit region 1, that is, the sections of 50% or more coincidence rate, can exist as many as possible in the intermediate region 3. For example, the pattern of the specific member in equal to or more than 50% of the total area of the intermediate region 3 can be similar to that in the pixel circuit region 1. The intermediate region 3 can surrounds the pixel circuit region 1 and the pattern in the pixel circuit region 1 can be repeated from the pixel circuit region 1 to the intermediate region 3 in both the row direction and the column direction.

Next, the structure of the imaging device 1000 is described in detail with reference to the sectional and plan views.

The sectional structure of the imaging device 1000 according to a first embodiment is described in detail. FIG. 3A is a sectional view of the imaging device 1000 according to the first embodiment taken along line A-B in FIG. 1. In FIG. 3A, the intermediate region 3, part of the pixel circuit region 1 near the intermediate region 3, and part of the peripheral circuit region 2 near the intermediate region 3 are illustrated. The first reference pixel region 102 is illustrated in the part of the pixel circuit region 1. FIG. 3B is a sectional view of the imaging device 1000 according to the first embodiment taken along line C-D in FIG. 1. In FIG. 3A, the intermediate region 3, part of the pixel circuit region 1 near the intermediate region 3, and part of the peripheral circuit region 2 near the intermediate region 3 are illustrated. The second reference pixel region 103 is illustrated in the part of the pixel circuit region 1. Since most of the sectional structures in FIGS. 3A and 3B are the same, both the structures are not distinguished from each other in the following description.

The imaging device 1000 is a layered structure formed of a plurality of layers stacked one on top of another in an area from the pixel circuit region 1 to the peripheral circuit region 2. The imaging device 1000 includes an element portion 10, a wiring portion 30, and a light-transmissive portion 50. The imaging device 1000 also includes light guide portions 41, which are included in a dielectric member 40, disposed between the element portion 10 and the light-transmissive portion 50.

The element portion 10 includes a semiconductor layer 11, an element isolation layer 12, an electrode layer 13, an insulating film 14, and electrically conductive members 15. The insulating film 14 is provided so as to cover the semiconductor layer 11, and the electrically conductive members 15, which are connected to the semiconductor layer 11, extend through the insulating film 14. Typically, the electrically conductive members 15 use contact plugs. The contact plugs are mainly formed of, for example, tungsten. The contact plugs can include titan and titanium nitride as barrier metal. The insulating film 14 can be a multilayer film that includes an anti-reflection layer 141 provided on photoelectric conversion portions 111 and an etching stopper layer (not illustrated) for the formation of the electrically conductive members 15.

The light receiving pixels 1010 include the photoelectric conversion portions 111, transfer gate electrodes 131, which are gate electrodes of the aforementioned transfer gates, and a floating diffusion (floating diffusion region), which forms the aforementioned floating nodes. The photoelectric conversion portions 111 typically use photodiodes formed in a well region 113 in the semiconductor layer 11.

Likewise, the first reference pixels 1020 include the photoelectric conversion portions 111 and the transfer gate electrodes 131. Although only the transfer gate electrodes 131 are illustrated in the drawings, gate electrodes for other transistors of the signal generating portions are also provided on the semiconductor layer 11.

The gate electrodes are provided on the semiconductor layer 11 with a gate insulating film interposed therebetween. Thus, the upper surfaces of the gate electrodes project from the surface of the semiconductor layer 11, and projections and recesses are formed corresponding to the presence and absence of the gate electrodes. The electrode layer 13 is an electrically conductive layer (for example, a polysilicon layer) that is used to form these gate electrodes. The electrode layer 13 is positioned between the semiconductor layer 11 and the insulating film 14. The electrode layer 13 can include members other than the gate electrodes formed of the same material (polysilicon) as that of the gate electrodes. These members can be used as wiring members, resistor members, dummy members for density adjustment, or the like. The element isolation layer 12 is formed of an insulation material by a known method such as local oxidation of silicon (LOCOS), shallow trench isolation (STI), or expanding photodiode design for isolation (EDI) along the light receiving surface on the surface of the semiconductor layer 11. The gate insulation film or the element isolation layer 12 is positioned between the semiconductor layer 11 and the electrode layer 13. The element isolation layer 12 is formed of an insulation material thicker than the gate insulation film. Some of the plurality of electrically conductive members 15 can be connected to the electrode layer 13.

In FIGS. 1, 3A, and 3B, the dot-dash lines represent the edges of the pixel circuit region 1 and the boundary between the pixel circuit region 1 and the intermediate region 3. The edges of the pixel circuit region 1 include all the pixel circuits positioned at the ends of the pixel circuit region 1 out of the plurality of pixel circuits. In the pixel circuit region 1 that includes the pixel circuits arranged in m rows and n columns, the pixel circuits positioned at the ends refers to the following pixel circuit groups: a pixel circuit group arranged in a row at one end (first row) in the column direction of the pixel circuit region 1; a pixel circuit group arranged in a row at the other end (mth row) in the column direction of the pixel circuit region 1; a pixel circuit group arranged in a column at one end (first column) in the row direction of the pixel circuit region 1; and a pixel circuit group arranged in a column at the other end (nth column) in the row direction of the pixel circuit region 1. The edges of the pixel circuit region 1 can be defined by four virtual lines that are each in contact with the outsides of the edges of the active regions of the semiconductor elements of the pixel circuits included in the pixel circuit group positioned at a corresponding one of the ends of the pixel circuit region 1. In this state, the pixel circuit region 1 forms a first quadrangle.

The edges of the peripheral circuit region 2 can be defined by virtual lines that are each in contact with the outsides of the edges of the active regions of the plurality of semiconductor elements out of the peripheral circuits positioned at a corresponding one of the ends of the peripheral circuit region 2 on the pixel circuit region 1 side. These virtual lines can be four lines parallel to the lines that define the edges of the pixel circuit region 1. In this state, the inner edges of the peripheral circuit region 2 form a second quadrangle.

The active regions of the semiconductor elements of the pixel circuits and the peripheral circuits are in contact with the element isolation region formed of the element isolation layer 12. Thus, the edges of the element isolation layer 12 are positioned at the inner and outer ends of the intermediate region 3. It is assumed that the intermediate region 3 is a region disposed between the first quadrangle that is assumed to be the inner edges of the intermediate region 3 and the second quadrangle that is assumed to be the outer edges of the intermediate region 3. Despite this, in the case where the pixel circuit or the peripheral circuit exists in a portion positioned between the first quadrangle and the second quadrangle, that portion is not included in the intermediate region 3 but included in the pixel circuit region 1 or the peripheral circuit region 2. Thus, the intermediate region 3 is determined to be a portion which is the region assumed to be the intermediate region 3 except for the portion to be included in the pixel circuit region 1 or the peripheral circuit region 2.

Part of the pixel circuit region 1 may be adjacent to the peripheral circuit region 2 without the intermediate region 3 interposed therebetween at the edges of the pixel circuit region 1 in the row or column direction. The intermediate region 3 becomes effective when the width thereof is equal to or more than 1 μm. When the distance between the pixel circuit region 1 and the peripheral circuit region 2 is less than 1 μm, it can be regarded that the pixel circuit region 1 and the peripheral circuit region 2 are in contact with each other. The intermediate region 3 has a square shape herein. Alternatively, the intermediate region 3 may be a U-shape or an L-shape region, or may be a single or a plurality of I-shape regions. When the intermediate region 3 is divided into a plurality of regions, it is sufficient that the total area used for calculating the occupancy rate be the sum of the areas of the divided regions of the intermediate region 3.

The wiring portion 30 is positioned on the element portion 10. The wiring portion 30 includes a first wiring layer 31, a second wiring layer 32 and a third wiring layer 33 on the element portion 10. Each of the first to third wiring layers 31 to 33 is an electrically conductive layer. The wiring portion 30 also includes an interlayer insulating film 20 that includes a first insulating layer 21, a second insulating layer 22, a third insulating layer 23, a fourth insulating layer 24, and a fifth insulating layer 25. The wiring portion 30 also includes a passivation film 26.

Furthermore, the wiring portion 30 includes via plugs 34, which connect the first wiring layer 31 and the second wiring layer 32 to each other, and via plugs 35, which connect the second wiring layer 32 and the third wiring layer 33 to each other. In the light receiving pixel region 101, by forming the third wiring layer 33 so as to have a grid shape, the third wiring layer 33 can be used as a light-shielding member that defines the optical paths in the light receiving pixels 1010. In the first reference pixel region 102, the third wiring layer 33 functions as a light-shielding member that shields the photoelectric conversion portions from light. The first to third wiring layers 31 to 33 are formed of, for example, aluminum or copper. The first to third wiring layers 31 to 33 may include barrier metal. The via plugs 34 and 35 are formed of tungsten or copper. The via plugs 34 and 35 may be integrally formed with the second and third wiring layers 32 and 33 of the same material as the material of the second and third wiring layers 32 and 33, or separately formed from the second and third wiring layers 32 and 33 of a material different from that of the second and third wiring layers 32 and 33.

The first insulating layer 21 is positioned at the same level as that of the first wiring layer 31. The second insulating layer 22 is positioned between the first wiring layer 31 and the second wiring layer 32. The fourth insulating layer 24 is positioned between the second wiring layer 32 and the third wiring layer 33. In addition to these first to fourth insulating layers 21 to 24, the interlayer insulating film 20 can include an anti-diffusion layer that prevents diffusion of a wiring material such as copper.

The passivation film 26 includes, for example, a silicon nitride layer, and, according to need, further includes an anti-reflection layer formed of, for example, a silicon oxynitride layer. By forming the surface of the passivation film 26 to have lens shapes, the passivation film 26 can have the lens function of in-layer lenses. Since a lower surface of the passivation film 26 covers the third wiring layer 33 in the intermediate region 3, the level of the lower surface of the passivation film 26 is higher in the intermediate region 3 than in the pixel circuit region 1 by the height of the third wiring layer 33. An upper surface of the passivation film 26 has projections that function as in-layer lenses. Due to these projections, the difference in average level variation of the upper surface of the passivation film 26 between the pixel circuit region 1 and the intermediate region 3 can be reduced.

The plurality of light guide portions 41 are arranged corresponding to the photoelectric conversion portions 111 in the pixel circuit region 1. It is sufficient that each of the plurality of light guide portions 41 extend through at least one of the insulating layers 21 to 24 of the interlayer insulating film 20. In the present example, the light guide portions 41 extend through the first to fourth insulating layers 21 to 24. Each of the light guide portions 41 serves as a light guide path from the light-transmissive portion 50 to a corresponding one of the photoelectric conversion portions 111. The light guide portions 41 are included in the dielectric member 40. The dielectric member 40 as the light guide portions 41 is a member formed of a dielectric material, and at least part of the dielectric member 40 is surrounded by the insulating layers of the interlayer insulating film 20. Light incident upon the light guide portions 41 is reflected by interfaces between the light guide portions 41 and the interlayer insulating film 20 so as to be guided to the photoelectric conversion portions 111. This can be realized when the dielectric member 40 that includes the light guide portions 41 is formed of a dielectric material having a refractive index and a dielectric constant that are different from those of the insulating layers. In particular, the light guide portions 41 can be formed of a dielectric material having a higher refractive index that those of the insulating layers because the light guide portions 41 having such a refractive index can cause total internal reflection between the insulating layers and the light guide portions 41. The dielectric material of the dielectric member 40 can be formed of, for example, a resin such as polyimide, acryl, or siloxane, or a silicon compound such as silicon nitride, silicon oxynitride, or silicon oxide. Alternatively, light incident upon the light guide portions 41 is reflected by interfaces between the light guide portions 41 and regions provided between the interlayer insulating film 20 and the light guide portions 41 so as to be guided to the respective photoelectric conversion portions 111. These regions are formed of gas, a porous material, or another substance having a lower refractive index than that of the dielectric material of the light guide portions 41, or a metal material having a metallic luster. When metallic reflection by metallic luster is used, the refractive index of the dielectric member 40 is not necessarily different from the refractive index of the insulating layers that surround the dielectric member 40. The dielectric constant of the dielectric member 40 may be higher than those of at least some of the insulating layers (for example, insulating layers 21 to 25) of the interlayer insulating film 20.

A connection portion 42 is provided on the interlayer insulating film 20. The connection portion 42 connects the plurality of light guide portions 41 to one another. The light guide portions 41 and the connection portion 42 are dielectric bodies formed of the same material. The light guide portions 41 and the connection portion 42 are integrated with one another to form the dielectric member 40, which is disposed over the plurality of continuously arranged pixel. The connection portion 42 may be omitted and a plurality of dielectric members 40, which each serve as a single light guide portion 41, may be separately arranged for the respective pixels.

In the pixel circuit region 1, in addition to the light guide portions 41 in the light receiving pixel region 101, dummy light guide portions 411, which are formed of the same dielectric material as that of the light guide portions 41, are disposed in the first reference pixel region 102 and the second reference pixel region 103. The dummy light guide portions 411 in the first reference pixel region 102 and the second reference pixel region 103 are formed to have the same depth as that of the light guide portions 41. Thus, the dummy light guide portions 411 extend through all the insulating layers through which the light guide portions 41 of the light receiving pixel region 101 extend. Originally, light guiding is not required for the first reference pixel region 102 and the second reference pixel region 103. However, by providing the dummy light guide portions 411 in these first and second reference pixel regions 102 and 103, a noise level of reference signals used for signal processing can more closely approximate a noise level in the light receiving pixel region 101.

In the present embodiment, in addition to the light guide portions 41 and the dummy light guide portions 411 in the pixel circuit region 1, dummy light guide portions 413, which are formed of the same dielectric material as that of the light guide portions 41, are provided in the intermediate region 3. The dummy light guide portions 413 in the intermediate region 3 are formed to have the same depth as that of the light guide portions 41. Accordingly, the dummy light guide portions 413 extend through all the insulating layers through which the light guide portions 41 of the pixel circuit region 1 extend. Thus, the dielectric member 40 that extends through arbitrary insulating layers is disposed in the pixel circuit region 1 and the intermediate region 3.

The light guide portions 41 and the dummy light guide portions 411 and 413 are formed through steps as follows. Initially, a plurality of holes are formed in the interlayer insulating film 20 so as to penetrate through the plurality of insulating layers of the interlayer insulating film 20. The dielectric member 40 is formed by filling the holes with the dielectric material. The upper surface of the dielectric member 40 having been filled in the holes is subjected to a planarization process according to need.

A fifth insulating layer 25 is provided on the dielectric member 40. The fifth insulating layer 25 is positioned between the passivation film 26 and the dielectric member 40. The fifth insulating layer 25 has a lower refractive index than that of the passivation film 26. Light incident upon the fifth insulating layer 25 from the passivation film 26 is condensed in accordance with Snell's law and incident upon the dielectric member 40.

The light-transmissive portion 50 includes a first planarized layer 51, a color filter layer 52, a second planarized layer 53, and a top lens layer 54. The color filter layer 52 is a multi-color filter layer in which color filters of a plurality of colors are arranged in a Bayer pattern or the like. Alternatively, the color filter layer 52 may be a monochrome filter layer. The first planarized layer 51 and the second planarized layer 53 are formed of, for example, resin layers.

Next, a planar structure of the imaging device 1000 is described in detail.

FIG. 4A illustrates examples of planar layouts of the element isolation layer 12 and the electrode layer 13 in a section indicated by a dotted line box E in FIG. 1 of the imaging device 1000 according to the first embodiment.

In FIG. 4A, the semiconductor layer 11 (active region) exposed from openings in the element isolation layer 12 is represented by diagonal hatching. The electrode layer 13 is represented by diagonal hatching extending in a direction different from a direction in which the diagonal hatching representing the semiconductor layer 11 extends. In portions where the electrode layer 13 and the semiconductor layer 11 are superposed with each other, the diagonal hatchings in the different directions intersect each other. The portions where the electrode layer 13 and the semiconductor layer 11 are superposed with each other can be portions where channels of transistors are formed.

FIG. 4A illustrates the positions of contacts that connect two of the semiconductor layer 11, the electrode layer 13, and the first wiring layer 31 to one another. The positions of the contacts correspond to the positions of the electrically conductive members 15 illustrated in FIG. 3A. The contacts include reference contacts 150 and non-reference contacts 151, which are other than the reference contacts 150. The reference contacts 150 are connected to the semiconductor layer 11 and supply a reference potential to the semiconductor layer 11. The non-reference contacts 151 include first-type contacts and second-type contacts. The first-type contacts are connected to the source and the drain of the transistors. The second-type contacts are connected to the gate of the transistors. The non-reference contacts 151 also include third-type contacts which directly connect the semiconductor layer 11 and the electrode layer 13 to one another without using the first wiring layer 31. The third contacts are so-called shared contacts.

The reference contacts 150, through which the reference potential is applied to the semiconductor layer 11 in the pixel circuit region 1, can be provided at least in the intermediate region 3. The reference potential, which is also referred to as a well potential or a body potential, is typically a ground potential, but may be a positive or negative potential. As illustrated in FIG. 4A, with many reference contacts 150 in the intermediate region 3 around the pixel circuit region 1, many reference contacts 150 can be provided around the pixel circuit region 1. Thus, the difference in the reference potential between a central portion and a peripheral portion of the pixel circuit region 1 can be reduced, thereby shading can be reduced.

Here, the reference contacts 150 are formed by connecting the electrically conductive members 15 such as contact plugs penetrating through the insulating layers in the intermediate region 3 to the semiconductor layer 11 as illustrated in FIGS. 3A and 3B. By connecting wiring, through which the reference potential is supplied, to the above-described electrically conductive members 15, the reference contacts 150 can be provided. Here, as illustrated in FIGS. 3A and 3B, the third wiring layer 33, which extends over a large area as a light shielding body, is used as the wiring, and the reference potential is applied to the electrically conductive members 15 through the second wiring layer 32 and the first wiring layer 31.

The reference contacts 150 may be provided also in the pixel circuit region 1. However, since the reference contacts 150 can be the sources of noise, the number of reference contacts 150 in the pixel circuit region 1 may be as small as possible. For example, one reference contact 150 may be provided for every three or more pixels. This can mean that, out of three types of pixels, which each receive light of a corresponding one of three primary-colors such as red, green, and blue, at least any two types of pixels do not have the corresponding reference contacts 150 provided near them. For example, when $L_B$ is a distance between a pixel B that receives light of a first wavelength and the reference contact 150 disposed nearest to the pixel B, $L_G$ is a distance between a pixel G that receives light of a second wavelength and the reference contact 150 disposed nearest to the pixel G, and $L_R$ is a distance between a pixel R that receives light of a third wavelength and one of the reference contact 150 disposed nearest to the pixel R. Here, the pixels R, G, and B are adjacent to one another. When one reference contact 150 is provided for every three or more adjacent pixels, the following relationships can be satisfied: $L_B<L_R$ and $L_B<L_G$. $L_B$ may be zero.

In one embodiment, one reference contact 150 may be provided for every four or more pixels. For example, when $L_{G1}$ is a distance between a G1 that receives light of the second wavelength and the reference contact 150 disposed nearest to the G1, $L_{G2}$ is a distance between a G2 that receives light of the second wavelength and the reference contact 150 disposed nearest to the G2, and the pixels R, G1, G2, and B are adjacent to one another. When one reference contact 150 is provided for every four or more pixels adjacent to one another, the following relationships can be satisfied: $L_B<L_{G1}$, $L_B<L_{G2}$, and $L_B<L_R$. This means that, in an area of a pixel arrangement of two rows and two columns in a Bayer pattern, only one corresponding reference contact 150 can be provided.

In yet another embodiment, one reference contact 150 may be provided for every five or more pixels. Or one reference contact 150 may be provided for every eight or more pixels. Furthermore, in yet another embodiment, one reference contact 150 may be provided for every 10 to 1000 pixels. Providing of one reference contact 150 for every M pixels (M being the number of pixels) means that when the number of the reference contacts 150 in the pixel circuit region 1 is $M_{RC}$, and the number of pixels in the pixel circuit region 1 is $M_P$, $M_{RC}/M_P$ coincides with or can approximate 1/M. That is, the number of the reference contacts 150 in the pixel circuit region 1 is equal to or less than 1/M times the number of pixels provided in the pixel circuit region 1. M may be equal to three or more. M can be equal to or more than 4, 5, 8, 10, or 1000. That is, the number of the reference contacts 150 in the pixel circuit region 1 can be equal to or less than ⅓ times the number of pixels provided in the pixel circuit region 1. Of course, M can be 1 or 2.

The density of the reference contacts 150 in the intermediate region 3 can be more than that in the pixel circuit region 1.

The difference in the density of the reference contacts 150 between the intermediate region 3 and the pixel circuit region 1 can be compared by $N_{RC}/N_{EL}$, which is the ratio of the number of reference contacts 150 $N_{RC}$ to the number of members formed of the electrode layer 13 $N_{EL}$. When $N_{RC3}/N_{EL3}$ is the ratio of the number of the reference contacts 150 $N_{RC3}$ to the number of dummy electrodes $N_{EL3}$ in the intermediate region 3, and $N_{RC1}/N_{EL1}$ is the ratio of the number of the reference contacts 150 $N_{RC1}$ to the number of electrodes $N_{EL1}$ in the pixel circuit region 1, $N_{RC3}/N_{EL3}$ can be more than $N_{RC1}/N_{EL1}$. Satisfying $N_{RC3}/N_{EL3}>N_{RC1}/N_{EL1}$ when the occupancy rates of the electrode layer 13 in the intermediate region 3 and the pixel circuit region 1 are similar to each other can mean that the density of the reference contacts 150 in the intermediate region 3 is increased compared to that in the pixel circuit region 1. When the occupancy rates of the electrode layer 13 in the intermediate region 3 and the pixel circuit region 1 are similar to each other, as mentioned above, the occupancy rate of the electrode layer 13 in the intermediate region 3 is from 0.5 to 1.5 times that in the pixel circuit region 1. In the first embodiment, since one reference contact 150 is provided for every four pixels, in a section of four pixels in the pixel circuit region 1, the number of gate electrodes $N_{EL1}=12$, $N_{RC1}=1$, and $N_{RC1}/N_{EL1}=1/12$. In a section of the same area in the intermediate region 3, the number of dummy electrodes $N_{EL3}=12$, $N_{RC3}=46$, and $N_{RC1}/N_{EL1}=46/12$. Thus, $N_{RC3}/N_{EL3}>N_{RC1}/N_{EL1}$ is satisfied.

As described above, the reference contacts 150 can be arranged in the intermediate region 3 at a density higher than that in the pixel circuit region 1, and the electrically conductive members 15 can be arranged in the intermediate region 3 at a density similar to that in the pixel circuit region 1. In the pixel circuit region 1, the non-reference contacts 151 are provided in addition to the reference contacts 150. For example, in one of the signal generating portions corresponding to one of the photoelectric conversion portions, five non-reference contacts 151 are used in addition to the reference contact 150. In the intermediate region 3 where no transistor is required, the occupation area of the non-reference contacts 151 can be replaced with the reference contacts 150. In the intermediate region 3, at least part of the occupation area corresponding to five contacts in a single signal generating portion of the pixel circuit region 1, can be replaced with the reference contacts 150.

The light guide portions 41 are each provided for a corresponding one of the pixels in the pixel circuit region 1. Thus, the number of the light receiving pixels 1010 and the number of the light guide portions 41 can coincide with each other at least in the light receiving pixel region 101. When the dummy light guide portions 411 are provided all the first reference pixel region 102 and the second reference pixel region 103, the number of light guide portions 41 and 411 ML in the pixel circuit region 1 coincides with MP. That is, the number of the reference contacts 150 in the pixel circuit region 1 is less than the number of the light guide portions in the pixel circuit region 1. In contrast, the number of reference contacts 150 can be more than the number of dummy light guide portions 413 in the intermediate region 3. The reason for this is that, in the intermediate region 3 where pixels serving as the sources of signals are not provided, even when many reference contacts 150 that can be the sources of noise are provided, the effects caused by these on the output signals of the pixel circuits are small.

FIG. 4B illustrates examples of planar layouts of the first wiring layer 31 and the second wiring layer 32 in the section indicated by the dotted line box E in FIG. 1 of the imaging device 1000 according to the first embodiment.

In FIG. 4B, the first wiring layer 31 is represented by diagonal hatching. The second wiring layer 32 is represented by diagonal hatching extending in a direction different from a direction in which the diagonal hatching representing the first wiring layer 31 extends. In portions where the first wiring layer 31 and the second wiring layer 32 are superposed with each other, the diagonal hatchings in the different directions intersect each other. The portions where the first wiring layer 31 and the second wiring layer 32 are superposed with each other as described above can be portions where the first wiring layer 31 and the second wiring layer 32 are connected to each other.

FIG. 4B illustrates the positions of vias that connect the first wiring layer 31 and the second wiring layer 32 to each other. The positions of vias correspond to the positions of via plugs that connect the first wiring layer 31 and the second wiring layer 32 to each other. FIG. 4B also illustrates the positions of contacts that connect the first wiring layer 31 to the semiconductor layer 11 or the electrode layer 13.

The positions of the contacts in FIG. 4A correspond to the positions of those in FIG. 4B. From the corresponding relationships between the contacts, the positional relationships among the wiring layers 31 and 32 and the element isolation layer 12 and the electrode layer 13 can be understood.

Here, the occupancy rates of the dielectric member 40, which includes the light guide portions 41 and the dummy light guide portions 411 and 413 and extends through the insulating layers, in the pixel circuit region 1 and the intermediate region 3 are respectively represented by $D_{LG1}$ and $D_{LG3}$. In this case, the specific member is the dielectric member 40, and the non-specific layer is the layers through which the light guide portions 41 extend.

The above-described $D_{LG1}$ and $D_{LG3}$ may satisfy the following relationship:

$$0.50 \leq D_{LG3}/D_{LG1} \leq 1.50 \tag{6a}$$

Moreover, $D_{LG1}$ and $D_{LG3}$ may satisfy the following relationship:

$$0.90 \leq D_{LG3}/D_{LG1} \leq 1.10 \tag{6b}$$

The coincidence rate of the planar layouts of the dielectric member 40, which includes the light guide portions 41 and the dummy light guide portions 411 and 413, in the pixel circuit region 1 and the intermediate region 3 is equal to or more than 50%. Moreover, this coincidence rate is equal to or more than 75%. The coincidence rate may be equal to or more than 90%. The coincidence rate may also be 100%.

Figure 7A:
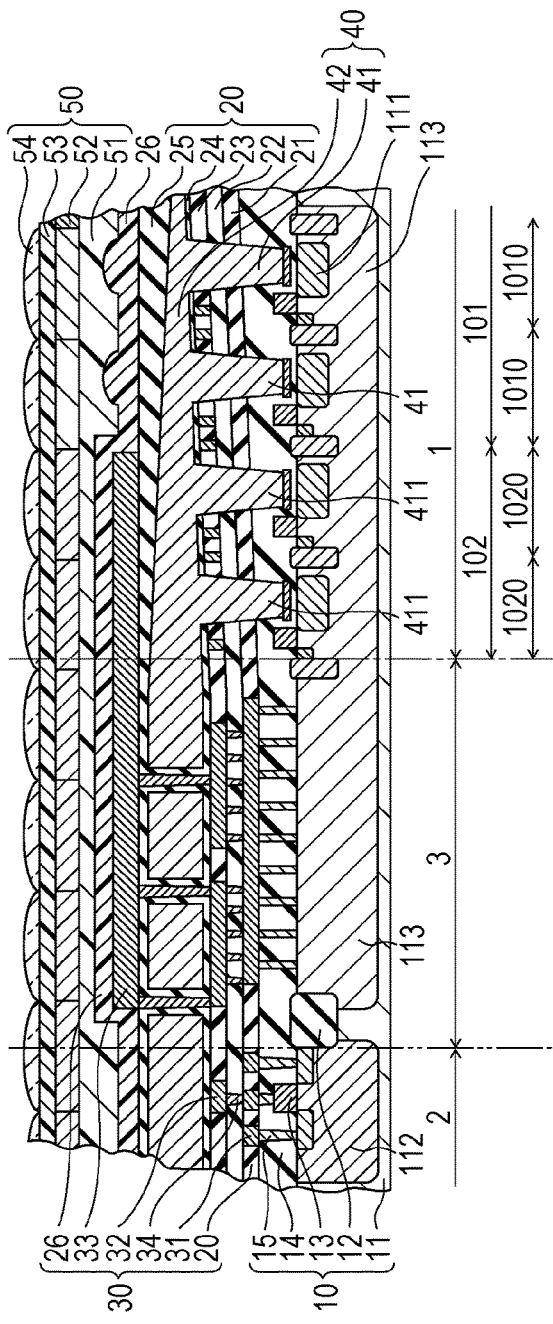
FIGS. 7A and 7B are schematic sectional views of an example of the imaging device.
Figure 7B:
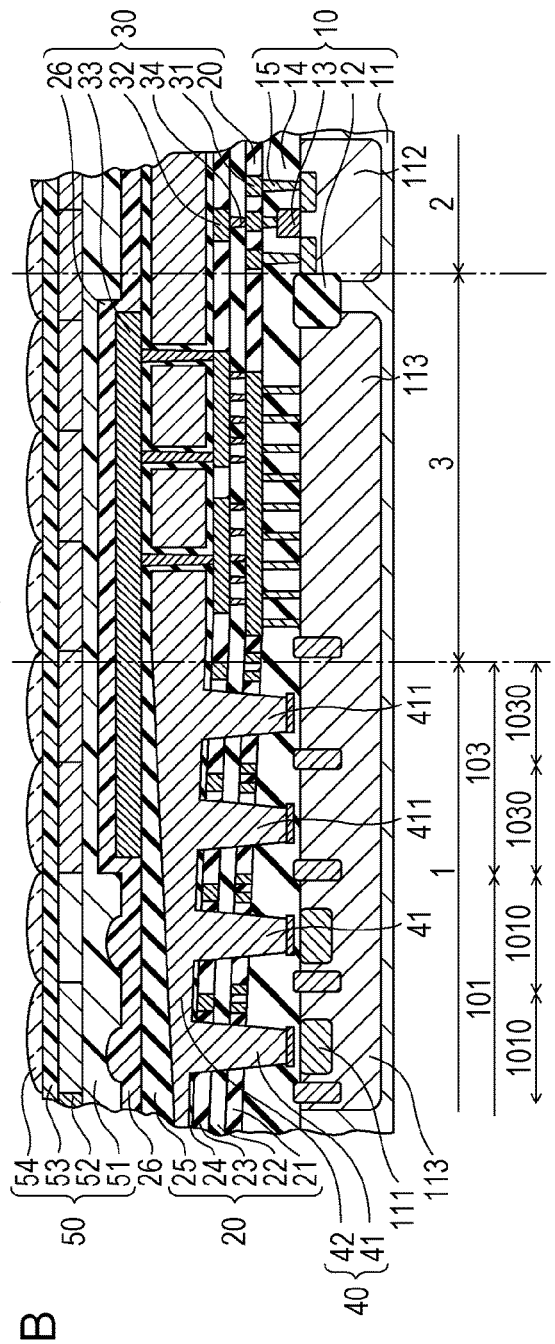
Figure 8B:
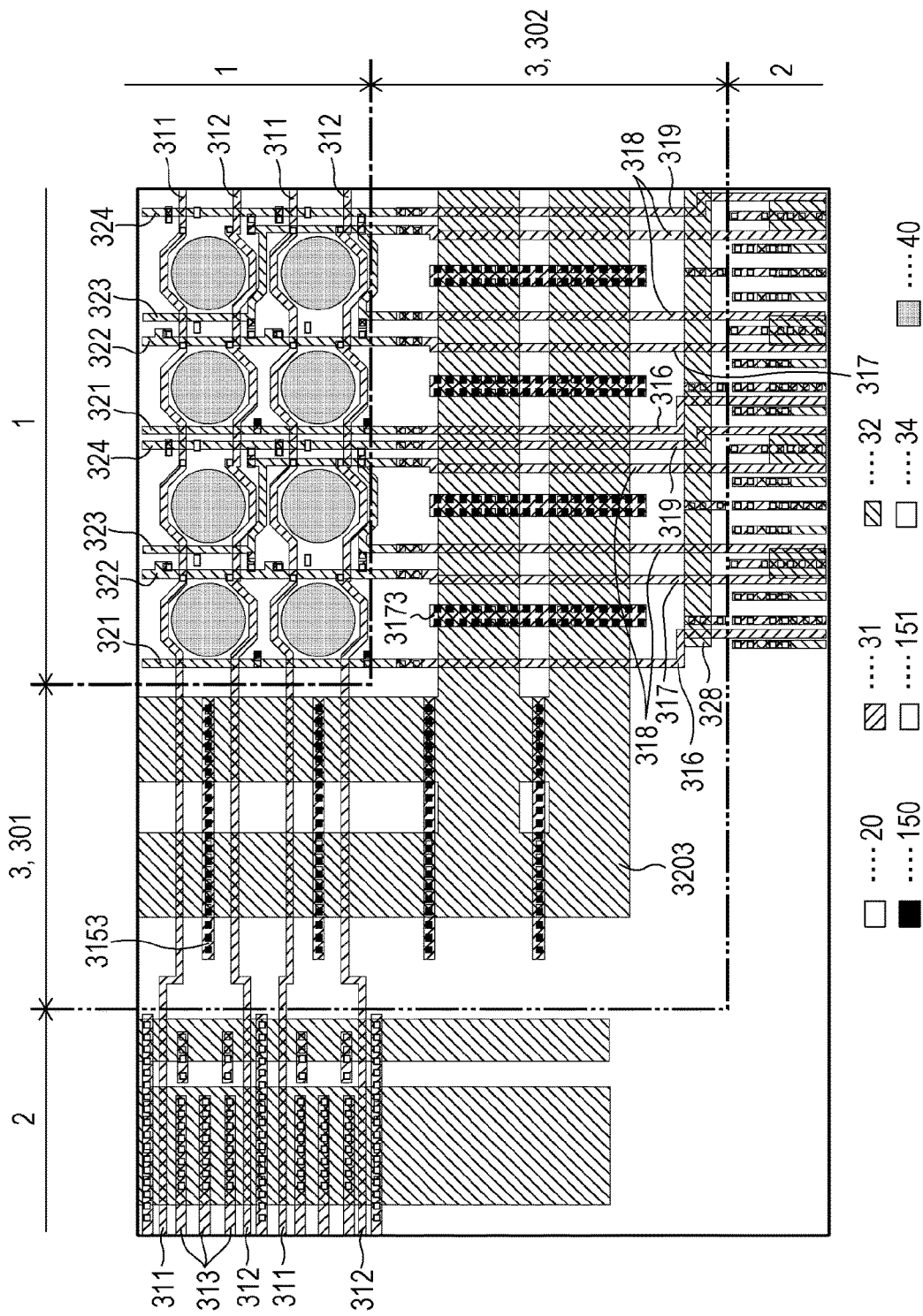

The sectional structure and the planar structure of the imaging device 1000 according to a reference embodiment are described. FIG. 7A is a sectional view of the imaging device 1000 according to the reference embodiment taken along line A-B in FIG. 1 and corresponds to FIG. 3A. FIG. 7B is a sectional view of the imaging device 1000 according to the reference embodiment taken along line C-D in FIG. 1 and corresponds to FIG. 3B. FIG. 8A illustrates examples of planar layouts of the element isolation layer 12 and the electrode layer 13 in a section indicated by the dotted line box E in FIG. 1 according to the reference embodiment of the imaging device 1000. FIG. 8B illustrates examples of planar layouts of the first wiring layer 31 and the second wiring layer 32 in the section indicated by the dotted line box E in FIG. 1 of the imaging device 1000 according to the reference embodiment. The same elements as those in the first embodiment are denoted by the same reference signs and detailed description thereof is omitted.

In the reference embodiment illustrated in FIGS. 7A, 7B, 8A, and 8B, the dielectric member 40 is not provided in the peripheral circuit region 2 and the intermediate region 3, and accordingly, $D_{LG2}$=0% and $D_{LG3}$=0%. Of course, these occupancy rates are not similar to that in the pixel circuit region 1. This means that, when the dielectric material that forms the dielectric member 40 is filled in the holes formed in the interlayer insulating film 20, the level of the upper surface of the dielectric material significantly varies between the pixel circuit region 1 and the peripheral circuit region 2. It is difficult to completely eliminate the variation of the level of the dielectric material even through a planarization process performed by using such a method as a reflow method, an etch back method, or a chemical mechanical polishing (CMP) method.

Thus, as a result, the upper surface of the dielectric member 40 is inclined as illustrated in FIGS. 7A and 7B. When such an inclination is formed, due to various causes, there is a difference in the output signal of the pixel circuit between the central portion and the peripheral portion of the pixel circuit region 1. The main causes of this include, for example, interference of light reflected by an interface between the insulating film 14 and the semiconductor layer 11 with light reflected by an interface between the dielectric member 40 and the fifth insulating layer 25 varies between the central portion and the peripheral portion of the pixel circuit region 1. Another cause may be a difference in the lengths of the light guide portion 41 in the pixel circuit region 1 and the peripheral circuit region 2. In a typical semiconductor production process, the level varies between the central portion and the peripheral portion of the pixel circuit region 1 by 100 nm. Regarding the interference conditions for visible light, although it depends on the wavelengths and the refractive indices of the media, the intensity of interference is inverted by a variation of the level of about 50 to 150 nm when a wavelength range is from 400 to 600 nm and the refractive index range is from 1.5 to 2.0. Thus, the variations of the levels of the upper surfaces of the layers formed in the pixel circuit region 1 may be 50 nm or less. For further improvement of the quality of images, the variations of the levels of the upper surfaces of the layers formed in the pixel circuit region 1 may be 25 nm or less.

In the first embodiment, the dummy light guide portions 411 and 413 are provided, and accordingly, the level difference of the upper surface of the dielectric member 40 produced between a region where the holes are arranged and a region where the holes are not arranged can be located at a position far from the light receiving pixel region 101. In particular, with the dummy light guide portions 413 provided in the intermediate region 3, the inclination of the upper surface of the dielectric member 40 between the light receiving pixel region 101 and the peripheral circuit region 2 can be reduced. As a result, the flatness is improved. Furthermore, the flatnesses of the first reference pixel region 102 and the second reference pixel region 103 of also improved. This improves the flatness of the third wiring layer 33 that functions as the light shielding body. This can suppress a situation in which light reflected by the third wiring layer 33 becomes stray light in the light receiving pixel region 101.

The similar effects can be obtained by providing the dummy light guide portions in the peripheral circuit region 2. However, since wiring for operation of the peripheral circuits is concentrated in the peripheral circuit region 2, it is difficult to provide the dummy light guide portions having a depth similar to that in the pixel circuit region 1. If the dummy light guide portions similar to those in the pixel circuit region 1 are provided, the freedom with which the peripheral circuits are laid out is significantly reduced. Furthermore, when the dielectric constant of the dielectric member 40 is higher than that of the interlayer insulating film 20, by providing the dielectric member 40 in the peripheral circuit region 2, capacity of the peripheral circuits is increased due to the dielectric constant of the dielectric member 40. This cause operating speeds of the circuits to be reduced. Since the peripheral circuits are used to operate at higher speeds than those of the pixel circuits, the dielectric member 40 having a high dielectric constant disposed in the peripheral circuit region 2 may cause the performance of the imaging device 1000 to be degraded.

In the first embodiment, the intermediate region 3 is provided between the pixel circuit region 1 and the peripheral circuit region 2, and the dummy light guide portions 413 are provided in this intermediate region 3. Thus, the dummy light guide portions that are more effective for planarization can be provided without restriction of the layout of the peripheral circuits. Accordingly, in the peripheral circuit region 2 of the first embodiment, the dielectric member 40 can be sufficiently planarized without providing the dummy light guide portions that extend through the insulating layers. Furthermore, in the intermediate region 3, the reference contacts 150, through which the constant reference potential is continued to be supplied, is provided instead of active elements such as transistors. With such a configuration, even when the dielectric member 40 having a high dielectric constant is provided, a situation in which operation of the imaging device 1000 is significantly affected can be avoided.

In particular, by disposing the dielectric member 40 also in the intermediate region 3 at an occupancy rate close to that of the dielectric member 40 provided as the specific member in the pixel circuit region 1 as described above, the flatness of a layer on the dielectric member 40 can be improved, and accordingly, high-quality imaging can be achieved.

In the first embodiment, the layout of the dummy light guide portions 413 in the intermediate region 3 is different from that of the light guide portions 41 in the pixel circuit region 1. The reason for this is to avoid interference of the electrically conductive members 15 for the formation of the reference contacts 150 with the dielectric member 40. With this configuration, the number of reference contacts 150 can be increased so that the reference contacts 150 are more useful for suppressing shading. Also, the reference contacts 150 can be arranged so that the reference contacts 150 are more useful for suppressing the shading.

Figure 5:
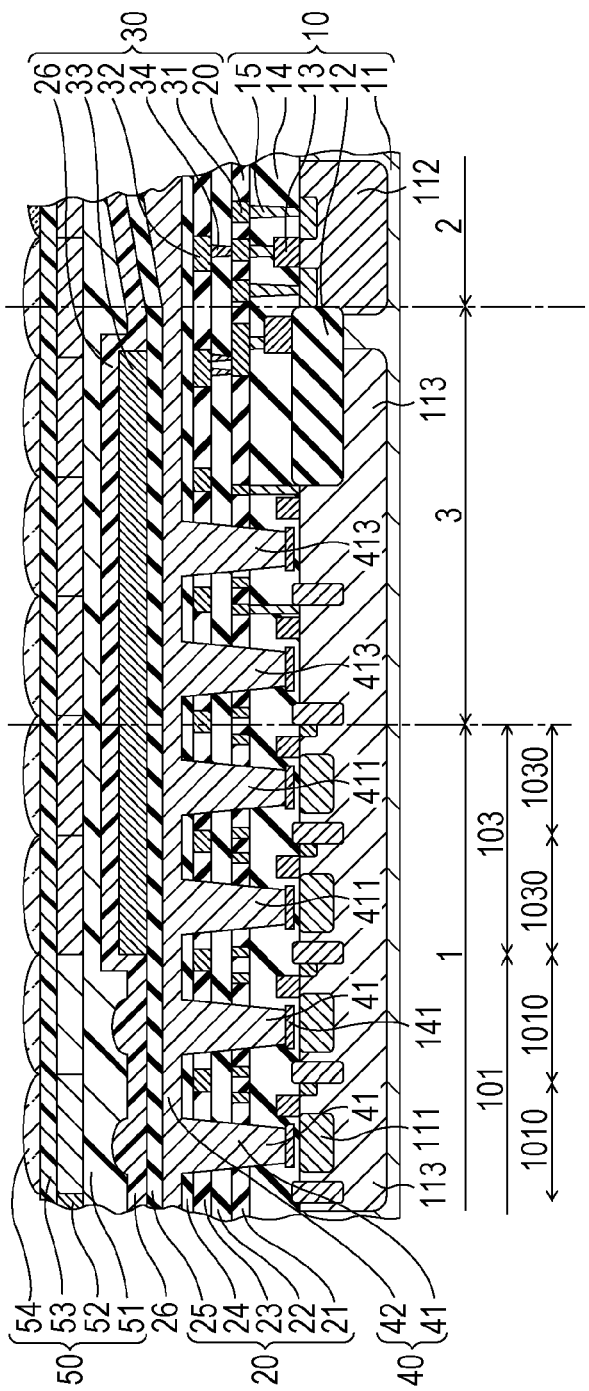
FIG. 5 is a schematic sectional view of an example of the imaging device.
Figure 6A:
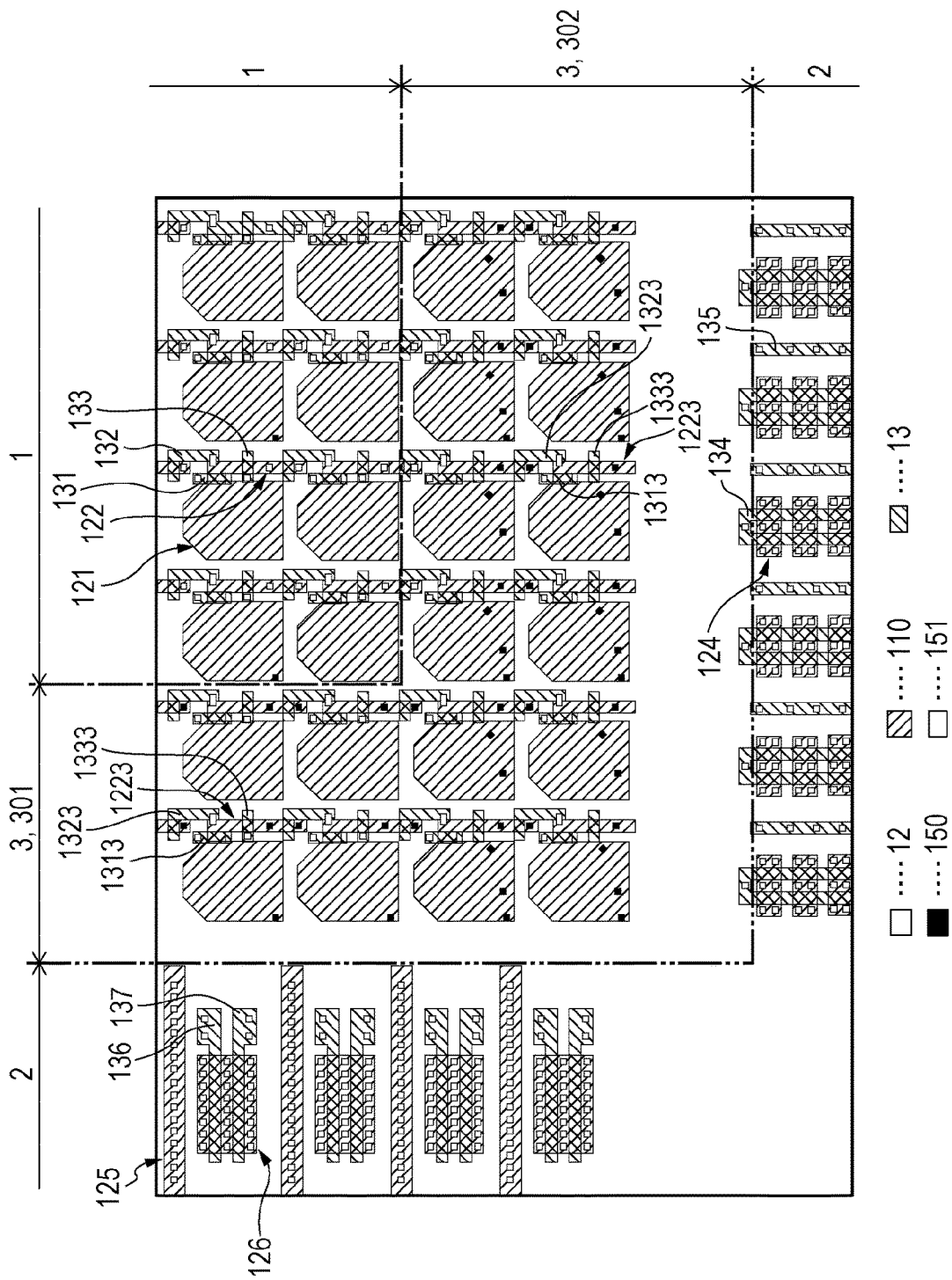

Next, referring to FIGS. 5, 6A and 6B, the imaging device 1000 according to the second embodiment is described. Description of structures, features, and the like common to the first and second embodiments is omitted.

FIG. 5 is a sectional view of the imaging device 1000 according to the second embodiment taken along line C-D in FIG. 1 and corresponds to FIG. 3B. FIG. 6A is an example of a planar layout of the dielectric member 40 that includes the dummy light guide portions 411 (or light guide portions 41) and the dummy light guide portions 413 in a section indicated by the dotted line box E in FIG. 1 of the imaging device 1000 according to the second embodiment. In FIG. 6B, the layouts of the first wiring layer 31 and the second wiring layer 32 are also illustrated. The planar layouts of the dielectric member 40, which includes the dummy light guide portions 411 and 413, in the pixel circuit region 1 and the intermediate region 3, are coincident with each other. The dimensions and shapes of the dummy light guide portions 411 (and light guide portions 41) and the dummy light guide portions 413 coincident with one another, and the arrangement pitch of the plurality of dummy light guide portions 411 and that of the plurality of dummy light guide portions 413 coincident with each other. Such a form can be achieved when the patterns of the first wiring layer 31 and the second wiring layer 32 in the pixel circuit region 1 are similar to, highly similar to, even more highly similar to, or coincide with those in the intermediate region 3. In such a configuration, the dummy light guide portions 413 do not interfere with the first wiring layer 31 and the second wiring layer 32 in the intermediate region 3. Thus, the arrangement of the dummy light guide portions 413 can be similar to, highly similar to, even more highly similar to, or coincide with those of the light guide portions 41 and the dummy light guide portions 411.

Referring to FIG. 6A, the structures of the element isolation layer 12, the electrode layer 13, and the electrically conductive members 15 described with reference to FIG. 5 are described.

The element isolation layer 12 provided in the pixel circuit region 1 has a pattern for exposing the semiconductor layer 11. The pattern of the element isolation layer 12 has first-type openings 121 that define portions of the active region, where the photoelectric conversion portions 111 are provided, in the semiconductor layer 11. The pattern of the element isolation layer 12 also has second-type openings 122 that define portions of the active region, where the source, the drain, and the channel of the transistors of the pixel circuits are provided, in the semiconductor layer 11. The area of the first-type openings 121 is larger than that of the second-type openings 122. In the present example, the transfer transistor is formed in a range extending from the portion of the active region defined by the first-type opening 121 to the portion of the active region defined by the second-type opening 122. The reset transistor is formed in the portion of the active region defined by the second-type opening 122. The amplification transistor is formed in the portion of the active region defined by the second-type opening 122 that defines the active region for the reset transistor of a different pixel. Here, in each of the pixels, the first-type opening 121 and the second-type opening 122 are continuous with each other, thereby forming a single opening. Alternatively, in each of the pixels, the first-type opening 121 and the second-type opening 122 may be separated from each other, thereby forming a plurality of openings. Alternatively, a single continuous opening may be provided for the plurality of pixels.

The element isolation layer 12 provided in the intermediate region 3 has a pattern for exposing the semiconductor layer 11. The pattern of the element isolation layer 12 has first-type openings 1213 that define first-type regions on the semiconductor layer 11. The pattern of the element isolation layer 12 also has second-type openings 1223 that define second-type regions, the area of which is smaller than that of the first-type region, on the semiconductor layer 11. The pattern of the element isolation layer 12 may have third-type openings 1233 that defines third type regions, the area of which is smaller than that of the second-type region, on the semiconductor layer 11.

The mutual positional relationship between the first-type openings 1213 and the second-type openings 1223 in the intermediate region 3 is similar to the mutual positional relationship between the first-type openings 121 and the second-type openings 122 in the pixel circuit region 1. In the present example, these positional relationships coincide with each other. In the intermediate region 3, a plurality of opening groups of the first-type openings 1213 and the second-type openings 1223 are formed. The mutual positional relationship (arrangement interval) of these opening groups is similar to that of opening groups in the pixel circuit region 1. In the present example, the positional relationships (arrangement intervals) in the pixel circuit region 1 and the intermediate region 3 coincide with each other.

The element isolation layer 12 in the peripheral circuit region 2 has a pattern that has openings 124, 125, and 126 that define portions of the active region for the transistors included in the peripheral circuits. The pattern of the element isolation layer 12 in the peripheral circuit region 2 is not similar to the pattern of the element isolation layer 12 in the pixel circuit region 1 and the pattern of the element isolation layer 12 in the intermediate region 3.

The electrode layer 13 in the pixel circuit region 1 includes gate electrode groups, which include transfer gate electrodes 131, amplification gate electrodes 132, and reset gate electrodes 133. The amplification gate electrodes 132 are the gate electrodes of the amplification transistors, and the reset gate electrodes 133 are the gate electrodes of the reset transistors. A plurality of gate electrode groups are formed in the pixel circuit region 1. The signal generating portions are formed of these gate electrode groups for the respective photoelectric conversion portions in the pixel circuit region 1.

First-type dummy electrodes 1313, second-type dummy electrodes 1323, and third-type dummy electrodes 1333 are formed of the electrode layer 13 in the intermediate region 3. The first-type dummy electrodes 1313 have a shape similar to that of the transfer gate electrodes 131 in the pixel circuit region 1. The first-type dummy electrode 1313 is also illustrated in FIG. 3A. As illustrated in FIG. 6A, in the present example, the shape of the first-type dummy electrodes 1313 coincide with (is congruent to) the shape of the transfer gate electrodes 131. The second-type dummy electrodes 1323 have a shape similar to that of the amplification gate electrodes 132 in the pixel circuit region 1. In the present example, the shape of the second-type dummy electrodes 1323 coincides with (is congruent to) the shape of the amplification gate electrodes 132. In the present example, the shape of the third-type dummy electrodes 1333 coincides with (is congruent to) the shape of the reset gate electrodes 133. The mutual positional relationships among the first to third-type dummy electrodes 1313, 1323, and 1333 in the intermediate region 3 are similar to the mutual positional relationships among the gate electrodes 131, 132, and 133 in the pixel circuit region 1. In the present example, these positional relationships in the intermediate region 3 coincide with those in the pixel circuit region 1. In the intermediate region 3, a plurality of dummy electrode groups of the first to third-type dummy electrodes 1313, 1323, and 1333 are formed. The mutual positional relationships among the plurality of dummy electrodes are similar to those among the plurality of gate electrodes. In the present example, the positional relationships among the plurality of dummy electrodes coincide with those among the plurality of gate electrodes.

Gate electrodes 134 of the transistors of the peripheral circuits are formed of the electrode layer 13 in the peripheral circuit region 2. The gate electrodes 134 serve as, for example, the gates of complementary metal oxide semiconductor (CMOS) circuits. The gate electrodes 134 may be formed as integral members that each serve as the gate electrode of an n-channel metal-oxide semiconductor (NMOS) transistor, the gate electrode of a P-channel metal oxide semiconductor (PMOS) transistor, and wiring that connects these transistors to each other. The electrode layer 13 in the peripheral circuit region 2 may have a structure different from the structures of those in the pixel circuit region 1 and the intermediate region 3. For example, the electrode layer 13 in the peripheral circuit region 2 may have a polycide structure, a lower portion of which is formed of polysilicon and an upper portion of which is formed of silicide.

Referring next to FIG. 6B, the configurations of the wiring layers 31 and 32 described with reference to FIG. 5 are described.

Initially, the configurations of the electrically conductive layers in the pixel circuit region 1 are described. The global wiring disposed across the pixel circuit region 1 is formed of the first wiring layer 31 and the second wiring layer 32. The global wiring in the pixel circuit region 1 includes transfer lines 311 and reset lines 312. The transfer lines 311 and the reset lines 312 extend in the row direction. The global wiring also includes the following lines extending in the column direction: reference lines 321, odd-number column output lines 322, power supply lines 323, and even-number column output lines 324. Lines other than the power supply lines 323 and the reference lines 321, that is, the transfer lines 311, the reset lines 312, the odd-number column output lines 322, and the even-number column output lines 324 are collectively referred to as signal lines.

A transfer signal (TX), which controls turning on and off of the transfer gates in the pixel circuit region 1, is transmitted through the transfer lines 311. A reset signal (RS), which controls turning on and off of the reset transistors in the pixel circuit region 1, is transmitted through the reset lines 312. The reference potential (GND) applied to the semiconductor layer 11 in the pixel circuit region 1 is transmitted through the reference lines 321. Signals from the signal generating portions of the pixels in the odd-number columns (PX1) are transmitted through the odd-number column output lines 322. A power supply potential (VDD) applied to the semiconductor layer 11 is transmitted through the power supply lines 323. Signals from the signal generating portions of the pixels in the even-number columns (PX2) are transmitted through the even-number column output lines 324.

In the pixel circuit region 1, the transfer lines 311 and the reset lines 312 serving as the global wiring are mainly formed of the first wiring layer 31. Also in the pixel circuit region 1, the reference lines 321, the odd-number column output lines 322, the power supply lines 323, and the even-number column output lines 324 serving as the global wiring are mainly formed of the second wiring layer 32. Local wiring, which connects the global wiring formed of the second wiring layer 32 to the semiconductor layer 11, is formed of the first wiring layer 31 in the pixel circuit region 1.

In the global wiring formed of the first wiring layer 31 (row wiring), the transfer lines 311 and the reset lines 312 have meandering shapes and substantially symmetric about a center line of the pixels in the row direction. The relationships among these lines are that the transfer lines 311 and the reset lines 312 of the global wiring formed of in the first wiring layer 31 are repeatedly arranged in this order.

In the global wiring formed of in the second wiring layer 32, the reference lines 321, the odd-number column output lines 322, and the even-number column output lines 324 has substantially linear shapes, and the power supply lines 323 has a meandering shape. The positional relationships among these lines are that the reference lines 321, the odd-number column output lines 322, the power supply lines 323, and the even-number column output lines 324 are repeatedly arranged in this order.

Next, the configuration of the wiring layers in the peripheral circuit region 2 is described. As is the case with the pixel circuit region 1, the transfer lines 311 and the reset lines 312 are formed of the first wiring layer 31 in the peripheral circuit region 2. Local wiring lines 313 of circuits of the vertical drive circuit each provided for a corresponding one of the rows use the first wiring layer 31. Global wiring lines 326 and 327, which connect these circuits provided for the rows to one another, use the second wiring layer 32.

In the peripheral circuit region 2, reference lines 316 connected to the reference lines 321, odd-number column output lines 317 connected to the odd-number column output lines 322, power supply lines 318 connected to the power supply lines 323, and even-number column output lines 319 connected to the even-number column output lines 324 are provided. Unlike the pixel circuit region 1, the reference lines 316, the odd-number column output lines 317, the power supply lines 318, and the even-number column output lines 319 are formed of the first wiring layer 31. Local wiring lines 314 of circuits of the signal processing circuits each provided for a corresponding one of the columns use the first wiring layer 31. Global wiring lines 328, which connect these circuits provided for the columns to one another, use the second wiring layer 32.

Next, the configurations of the electrically conductive layers such as the first wiring layer 31 and the second wiring layer 32 in the intermediate region 3 are described. Here, the left region 301, which is a region between the pixel circuit region 1 and the vertical drive circuit 202, and the lower region 302, which is a region between the pixel circuit region 1 and the horizontal drive circuit 203, of the intermediate region 3 are separately described.

The transfer lines 311 and the reset lines 312 extend in the left region 301 so as to transmit the signals (TX and RS) from the vertical drive circuit 202. In the intermediate region 3, as is the case with the pixel circuit region 1, the transfer lines 311 and the reset lines 312 are formed of the first wiring layer 31. Unlike the second embodiment, in the first embodiment, the transfer lines 311 and the reset lines 312 in the left region 301 have, unlike those in the pixel circuit region 1 having meandering shapes, linear shapes.

Furthermore, in the left region 301, as the global wiring lines that extend in the column direction so as to be arranged across the intermediate region 3, the following four types of reference lines are provided: a first-type reference line 3213, a second-type reference line 3223, a third-type reference line 3233, and a fourth-type reference line 3243. The first to fourth-type reference lines 3213, 3223, 3233, and 3243 are formed of the second wiring layer 32 illustrated in the sectional view of FIG. 5.

The first-type reference line 3213 has a shape similar to that of the reference lines 321 in the pixel circuit region 1, and the positional relationships of the first-type reference line 3213 with the other reference lines are equal to those of the reference lines 321 in the pixel circuit region 1. The second-type reference line 3223 has a shape similar to that of the odd-number column output lines 322 in the pixel circuit region 1, and the positional relationships of the second-type reference line 3223 with the other reference lines are equal to those of the odd-number column output lines 322 in the pixel circuit region 1. The third-type reference line 3233 has a shape similar to that of the power supply lines 323 in the pixel circuit region 1, and the positional relationships of the third-type reference line 3233 with the other reference lines are equal to those of the power supply lines 323 in the pixel circuit region 1. The fourth-type reference line 3243 has a shape similar to that of the even-number column output lines 324 in the pixel circuit region 1, and the positional relationships of the fourth-type reference line 3243 are equal to those of the even-number column output lines 324 in the pixel circuit region 1. Specifically, the first-type reference line 3213, the second-type reference line 3223, and the fourth-type reference line 3243 have linear shapes, and the third-type reference line 3233 has a meandering shape. The positional relationships among the first to fourth-type reference lines 3213 to 3243 are that the first to fourth-type reference lines 3213 to 3243 are arranged in this order. Thus, the densities and the planar layouts of the second wiring layer 32 are similar to each other between the pixel circuit region 1 and the intermediate region 3.

The first-type reference line 3213 and the second-type reference line 3223, which are formed of the second wiring layer 32, in the intermediate region 3 are respectively connected to a first-type reference line 3162 and a second-type reference line 3172, which are formed of the first wiring layer 31, in the peripheral circuit region 2. The third-type reference line 3233 and the fourth-type reference line 3243, which are formed of the second wiring layer 32, in the intermediate region 3 are respectively connected to third-type reference lines 3182 and a fourth-type reference line 3192, which are formed of the first wiring layer 31, in the peripheral circuit region 2.

Through each of the first to fourth reference lines 3213 to 3243, the reference signal (GND) is transmitted so as to apply the reference potential to the semiconductor layer 11 in the left region 301 of the intermediate region 3.

The reference lines 321, the odd-number column output lines 322, the power supply lines 323, and the even-number column output lines 324 extend in the lower region 302 so as to allow the signals (GND, VDD, PX1, and PX2) from the horizontal drive circuit to be transmitted therethrough. Similarly to those in the pixel circuit region 1, the reference lines 321, the odd-number column output lines 322, the power supply lines 323, and the even-number column output lines 324 are formed of the second wiring layer 32 in the intermediate region 3. In the second embodiment, the power supply lines 323 have a meandering shape in the lower region 302 similarly to those in the pixel circuit region 1.

The reference lines 321 and the odd-number column output lines 322, which are formed of the second wiring layer 32, in the lower region 302 are respectively connected to the reference lines 316 and the odd-number column output lines 317, which are formed of the first wiring layer 31, in the peripheral circuit region 2. The power supply lines 323 and the even-number column output lines 324, which are formed of the second wiring layer 32, in the lower region 302 are respectively connected to the power supply lines 318 and the even-number column output lines 319 in the peripheral circuit region 2.

Furthermore, in the lower region 302, as the global wiring lines that extend in the row direction so as to be vertically arranged over the intermediate region 3, the following two types of reference lines are provided: fifth-type reference lines 3113 and sixth-type reference lines 3123. The fifth-type reference lines 3113 are spaced apart from one another by a distance equal to a distance by which the transfer lines 311 in the pixel circuit region 1 are spaced apart from one another. The sixth-type reference lines 3123 are spaced apart from one another by a distance equal to a distance by which the reset lines 312 in the pixel circuit region 1 are spaced apart from one another. In the pixel circuit region 1, the transfer lines 311 and the reset lines 312 have meandering shapes. In contrast, the fifth-type reference lines 3113 and the sixth-type reference lines 3123 have linear shapes.

Through each of the fifth-type reference lines 3113 and the sixth-type reference lines 3123, the reference signal (GND) is transmitted so as to cause the semiconductor layer 11 in the lower region 302 of the intermediate region 3 to be set at the reference potential.

Next, other configurations are described. As illustrated in FIGS. 5, 6A, and 6B, the element isolation layer 12 formed of an insulation material is positioned in the pixel circuit region 1 and the intermediate region 3. The element isolation layer 12 in the intermediate region 3 can be used as dummy members. Here, the occupancy rate of the element isolation layer 12 in the pixel circuit region 1 is represented by $D_{FL1}$ and the occupancy rate of the element isolation layer 12 in the intermediate region 3 is represented by $D_{FL3}$. The specific layer is the element isolation layer 12 and the non-specific layer is the semiconductor layer 11. For example, $D_{FL1}$ is 20%. In the present example, these $D_{FL1}$ and $D_{FL3}$ satisfy the following relationship: $0.9 \le D_{FL3}/D_{FL1} \le 1.1$.

Also, the electrode layer 13 is positioned in the pixel circuit region 1 and the intermediate region 3. The electrode layer 13 in the intermediate region 3 can be used as dummy members. Here, the occupancy rate of the electrode layer 13 in the pixel circuit region 1 is represented by $D_{EL1}$ and the occupancy rate of the electrode layer 13 in the intermediate region 3 is represented by $D_{EL3}$. In this case, the specific layer is the electrode layer 13 and the non-specific layer is the insulating film 14. $D_{EL1}$ is for example, 25%. In the present example, these $D_{EL1}$ and $D_{EL3}$ satisfy the following relationship: $0.9 \le D_{EL3}/D_{EL1} \le 1.1$.

Also, the plurality of electrically conductive members 15 are positioned in the pixel circuit region 1 and the intermediate region 3. Here, the occupancy rate of the electrically conductive members 15 in the pixel circuit region 1 is represented by $D_{CP1}$ and the occupancy rate of the electrically conductive members 15 in the intermediate region 3 is represented by $D_{CP3}$. In this case, the specific member is the electrically conductive members 15 and the non-specific layer is the insulating film 14. In the present example, these $D_{CP1}$ and $D_{CP3}$ satisfy the following relationship: $0.8 \le D_{CP3}/D_{CP1} \le 1.2$.

Also, the first wiring layer 31 is positioned in the pixel circuit region 1 and the intermediate region 3. The first wiring layer 31 in the intermediate region 3 can be used as wiring that connects the pixel circuits and the peripheral circuits to one another. Here, the occupancy rate of the first wiring layer 31 in the pixel circuit region 1 is represented by $D_{M11}$ and the occupancy rate of the first wiring layer 31 in the intermediate region 3 is represented by $D_{M13}$. In this case, the specific layer is the first wiring layer 31 and the non-specific layer is the second insulating layer 22. $D_{M11}$ is, for example, 25%. In the present example, these $D_{M11}$ and $D_{M13}$ satisfy the following relationship: $0.8 \le D_{M13}/D_{M11} \le 1.2$.

Also, the second wiring layer 32 is positioned in the pixel circuit region 1 and the intermediate region 3. The second wiring layer 32 in the intermediate region 3 can be used as wiring that connects the pixel circuits and the peripheral circuits to one another. Here, the occupancy rate of the second wiring layer 32 in the pixel circuit region 1 is represented by $D_{M21}$ and the occupancy rate of the second wiring layer 32 in the intermediate region 3 is represented by $D_{M23}$. In this case, the specific layer is the second wiring layer 32 and the non-specific layer is the third insulating layer 23. $D_{M21}$ is, for example, 20%. In the present example, these $D_{M21}$ and $D_{M23}$ satisfy the following relationship: $0.8 \le D_{M23}/D_{M21} \le 1.2$.

As described above, the element isolation layer 12, the electrode layer 13, the first wiring layer 31, and the second wiring layer 32 can be the specific layers, for which the difference in the density in the pixel circuit region 1 and that in the intermediate region 3 is to be reduced. Likewise, the difference in the density between the electrically conductive members 15 in the pixel circuit region 1 and those in the intermediate region 3 can be reduced. In order to do this, as described above, the occupancy rates of these layers as specific layers in the pixel circuit region 1 and those in the intermediate region 3 can be similar to, highly similar to, even more highly similar to, or coincide with one another. Furthermore, the coincidence rates of the patterns of these layers as the specific layers in the pixel circuit region 1 and the intermediate region 3 can be similar to, highly similar to, even more highly similar to, or coincide with one another.

By setting the element isolation layer 12, the electrode layer 13, the first wiring layer 31, and the second wiring layer 32 as the specific layers, the flatness of the non-specific layers positioned at the same levels as the levels of the specific layers or layers on the non-specific layers can be improved. In contrast, as is the case with the reference embodiment described below, in the case where the occupancy rate of the specific layer in the pixel circuit region 1 is significantly different from that in the intermediate region 3, the flatness of the non-specific layer positioned at the same level as the specific layer or the layers on the specific layer is degraded.

In the reference embodiment illustrated in FIGS. 7A, 7B, 8A, and 8B, the element isolation layer 12 is not provided in the intermediate region 3, and accordingly, $D_{FL3} \approx 0$. Thus, the occupancy rate of the element isolation layer 12 in the intermediate region 3 is not similar to that in the pixel circuit region 1. Also, the electrode layer 13 is not provided in the intermediate region 3, and accordingly $D_{EL3} \approx 0$. Thus, the occupancy rate of the electrode layer 13 in the intermediate region 3 is not similar to that in the pixel circuit region 1. The density of the electrically conductive members 15 in the intermediate region 3 is higher than that in the pixel circuit region 1. Thus, for example, $D_{CP3}/D_{CP1}>1.5$, and the occupancy rate of the electrically conductive members 15 in the intermediate region 3 and that in the pixel circuit region 1 are not similar to each other.

Thus, when the density of either or both of the element isolation layer 12 and the electrode layer 13 is lower in the intermediate region 3 than in the pixel circuit region 1, the level of the upper surface of the insulating film 14, which is formed at the same level or on the either or both of the element isolation layer 12 and the electrode layer 13, may be higher in the pixel circuit region 1 than that in the intermediate region 3, and accordingly, the upper surface of the insulating film 14 may be inclined. The reason for this is that the levels of the upper surfaces of the element isolation layer 12 and the electrode layer 13 are higher than the level of the surface of the semiconductor layer 11. It is difficult to completely eliminate the inclination of the insulating film 14 as described above even through a planarization process performed by using such a method as a reflow method, an etch back method, or a CMP method on the insulating film 14. Furthermore, when the density of the electrically conductive members 15 is higher in the intermediate region 3 than that in the pixel circuit region 1, the level of the upper surface of the insulating film 14, which is formed at the same level or on the electrically conductive members 15, tends to increase in the pixel circuit region 1 than in the intermediate region 3. The reason for this is that, when the material of the electrically conductive members 15 such as tungsten filled in the contact holes formed in the insulating film 14 is removed by the CMP method, erosion is easily occur in portions where the density of the contact holes is high. Unavoidably, the upper surface of the insulating layer formed on the insulating film 14, the upper surface of which is inclined as described above, is inclined in accordance with the inclination of the upper surface of the insulating film 14.

Furthermore, the density of the first wiring layer 31 is higher in the intermediate region 3 than that in the pixel circuit region 1. Specifically, the first wiring layer 31 provided in the lower region 302 and the first wiring layer 31 provided in the upper region of the intermediate region 3 similarly to the first wiring layer 31 in the lower region 302 increase the occupancy rate of the first wiring layer 31 in the intermediate region 3. For example, $D_{M13}=40\%$ and $D_{M13}/D_{M11}=1.6$, and accordingly, the occupancy rate of the first wiring layer 31 in the intermediate region 3 and that in the pixel circuit region 1 are not similar to each other. Also, the density of the second wiring layer 32 is higher in the intermediate region 3 than that in the pixel circuit region 1. Thus, for example, $D_{M23}=80\%$ and $D_{M23}/D_{M21}=4.0$, and the occupancy rate of the second wiring layer 32 in the intermediate region 3 and that in the pixel circuit region 1 are not similar to each other.

Here, a case in which either or both of the first wiring layer 31 and the second wiring layer 32 are aluminum layers is described. When the density of the aluminum layer in the intermediate region 3 is higher than that in the pixel circuit region 1, the level of the upper surface of the insulating layer that covers the aluminum layer and is formed at the same level as that of the aluminum layer or on the aluminum layer is higher in the intermediate region 3 than that in the pixel circuit region 1, and accordingly, the upper surface of the insulating layer is inclined. The reason for this is that the level of the upper surface of the aluminum layer patterned by an etching method is higher than the level of the surface of the lower insulating layer. It is difficult to completely eliminate the inclination of the insulating layer that covers the aluminum layer as described above even through a planarization process performed by using such a method as a reflow method, an etch back method, or a CMP method on the insulating layer.

Here, a case in which either or both of the first wiring layer 31 and the second wiring layer 32 are copper layers is described. When the density of the copper layer in the intermediate region 3 is higher than that in the pixel circuit region 1, the level of the upper surface of the insulating layer that covers the copper layer and is formed at the same level as that of the copper layer or on the copper layer is lower in the intermediate region 3 than that in the pixel circuit region 1, and accordingly, the upper surface of the insulating layer may be inclined. The reason for this is that, when wiring density is high in a portion or portions of the upper surface of the copper layer patterned by a damascene method, erosion easily occurs in such a portion or portions. It is difficult to completely eliminate the inclination of the insulating layer that covers the copper layer as described above even through a planarization process performed by using such a method as a reflow method, an etch back method, or a CMP method on the insulating layer.

Thus, as a result, the upper surfaces of the insulating film 14 and the insulating layers of the interlayer insulating film 20 are inclined as illustrated in FIGS. 7A and 7B. When such inclinations are formed, due to various causes, there is a difference in the output signal between the central portion and the peripheral portion of the pixel circuit region 1. The main causes of this include, for example, interference of light reflected by an interface between the insulating film 14 and the semiconductor layer 11 with light reflected by an interface between the interlayer insulating film 20 and the passivation film 26 varies between the central portion and the peripheral portion of the pixel circuit region 1. In a typical semiconductor production process, the level varies between the central portion and the peripheral portion of the pixel circuit region 1 by 100 nm. Regarding the interference conditions for visible light, although it depends on the wavelengths and the refractive indices of the media, the intensity of interference is inverted by a variation of the level of about 50 to 150 nm when a wavelength range is from 400 to 600 nm and the refractive index range is from 1.5 to 2.0. Thus, the variations of the levels of the upper surfaces of the layers formed in the pixel circuit region 1 may be 50 nm or less. For further improvement of the quality of images, the variations of the levels of the upper surfaces of the layers formed in the pixel circuit region 1 may be 25 nm or less.

In such a configuration, by disposing the specific layer in the intermediate region 3 at an occupancy rate close to that of the specific layer provided in the pixel circuit region 1 as described above, the flatness of a layer on the specific layer can be improved, and accordingly, high-quality imaging can be achieved.

With the above-described embodiments, an imaging device, with which a good image can be obtained, can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-212290, filed Oct. 9, 2013, which is hereby incorporated by reference herein in its entirety.

What is claimed is:

1. An imaging device comprising:
a pixel circuit region that includes photoelectric conversion portions, each of the photoelectric conversion portions being included in a corresponding one of pixel circuits;
a peripheral circuit region positioned at a periphery of the pixel circuit region, the peripheral circuit region including a peripheral circuit; and
an intermediate region positioned between the pixel circuit region and the peripheral circuit region,
wherein a semiconductor layer and an insulating layer positioned on the semiconductor layer are disposed in the pixel circuit region, the peripheral circuit region and the intermediate region,
wherein the insulating layer has a first face which faces toward the semiconductor layer and a second face which is opposite to the first face,
wherein dielectric members that extend through the insulating layer in a direction from the second face toward the first face are disposed in the pixel circuit region and the intermediate region,
wherein the pixel circuit region includes first contacts through which a constant potential is supplied to the semiconductor layer,
wherein the intermediate region includes second contacts through which the constant potential is supplied to the semiconductor layer, and
wherein a distance between closest two of the second contacts is smaller than a distance between closest two of the first contacts.

2. The imaging device according to claim 1,
wherein an electrically conductive layer is provided on the semiconductor layer in the pixel circuit region, the peripheral circuit region, and the intermediate region, the electrically conductive layer including wiring that connects the pixel circuit region and the peripheral circuit region to each other in the intermediate region, and
wherein the electrically conductive layer includes wiring that extends from the intermediate region to the pixel circuit region.

3. The imaging device according to claim 2,
wherein, in the pixel circuit region, the peripheral circuit region, and the intermediate region, a wiring layer is disposed at a position closer to the semiconductor layer than the electrically conductive layer, and the wiring layer includes, in the intermediate region, wiring that connects the pixel circuit and the peripheral circuit to each other.

4. The imaging device according to claim 3,
wherein the insulating layer is positioned between the electrically conductive layer and the wiring layer.

5. The imaging device according to claim 1,
wherein, in a plane along a light-receiving surface of the semiconductor layer, when a section of the pixel circuit region that contains at least one of the pixel circuits is defined as a first section, a section of the intermediate region having an outline congruent to an outline of the first section is defined as a second section, and
wherein a number of the second contacts in the second section is more than a number of the dielectric members in the first section.

6. The imaging device according to claim 5,
wherein a number of the first contacts in the first section is less than the number of the second contacts in the second section.

7. The imaging device according to claim 1,
wherein the pixel circuit region further includes
a pixel that includes
a photoelectric conversion portion capable of receiving light, and
a signal generating portion that generates a signal in accordance with a charge of the photoelectric conversion portion capable of receiving light,
a pixel that includes
a photoelectric conversion portion shielded from light, and
a signal generating portion that generates a signal in accordance with the charge of the photoelectric conversion portion shielded from light, and
wherein the intermediate region does not include a pixel that outputs a signal for forming an image.

8. The imaging device according to claim 1,
wherein, in a plane along a light-receiving surface of the semiconductor layer, an area occupancy rate of the dielectric members in the intermediate region with respect to a total area of the intermediate region is from 0.5 to 1.5 times an area occupancy rate of the dielectric members in the pixel circuit region with respect to a total area of the pixel circuit region.

9. The imaging device according to claim 1, wherein the constant potential is a ground potential.

10. An imaging device comprising:
a pixel circuit region that includes photoelectric conversion portions, each of the photoelectric conversion portions being included in a corresponding one of pixel circuits;
a peripheral circuit region positioned at a periphery of the pixel circuit region, the peripheral circuit region including a peripheral circuit; and
an intermediate region positioned between the pixel circuit region and the peripheral circuit region, and including contacts through which a well potential of the pixel circuits is supplied,
wherein a semiconductor layer and an insulating layer positioned on the semiconductor layer are disposed in the pixel circuit region, the peripheral circuit region, and the intermediate region,
wherein the insulating layer has a first face which faces toward the semiconductor layer and a second face which is opposite to the first face,
wherein dielectric members that extend through the insulating layer in a direction from the second face toward the first face are disposed in the pixel circuit region and the intermediate region,
wherein each of the dielectric members in the pixel circuit region is overlapped with a corresponding one of the photoelectric conversion portions in the direction, and
wherein at least one of dielectric members in the intermediate region is not overlapped with any photoelectric conversion portions in the direction.

11. The imaging device according to claim 10,
wherein, in a plane along a light-receiving surface of the semiconductor layer, an area occupancy rate of the dielectric members in the intermediate region with respect to a total area of the intermediate region is from 0.5 to 1.5 times an area occupancy rate of the dielectric members in the pixel circuit region with respect to a total area of the pixel circuit region.

12. The imaging device according to claim 10,
wherein, in a plane along a light-receiving surface of the semiconductor layer, when a section of the pixel circuit region that contains at least one of the pixel circuits is defined as a first section, a section of the intermediate region having an outline congruent to an outline of the first section is defined as a second section, and the dielectric members are positioned in the first section and the second section, a coincidence rate between patterns of the dielectric members in the first section and the second section is equal to or more than 50%.

13. The imaging device according to claim 10,
wherein a dielectric constant of the dielectric members is higher than a dielectric constant of the insulating layer.

14. An imaging device comprising:
a pixel circuit region that includes photoelectric conversion portions, each of the photoelectric conversion portions being included in a corresponding one of pixel circuits and being configured to receive light;
a peripheral circuit region positioned at a periphery of the pixel circuit region, the peripheral circuit region including a peripheral circuit; and
an intermediate region positioned between the pixel circuit region and the peripheral circuit region,
wherein a semiconductor layer and an insulating layer positioned on the semiconductor layer are disposed in the pixel circuit region, the peripheral circuit region and the intermediate region,
wherein the insulating layer has a first face which faces toward the semiconductor layer and a second face which is opposite to the first face,
wherein dielectric members that extend through the insulating layer in a direction from the second face toward the first face are disposed in the pixel circuit region and the intermediate region,
wherein the pixel circuit region includes a first plurality of contacts, the intermediate region includes a second plurality of contacts, each of the first plurality of contacts and the second plurality of contacts providing an electronic connection with the semiconductor layer, and
wherein a number of the first plurality of contacts in a first square section within the pixel circuit region is less than a number of the second plurality of contacts in a second square section within the intermediate region, the first and second square sections having four sides of the same length more than 10 μm and less than 100 μm.

15. The imaging device according to claim 14,
wherein the pixel circuit region, the peripheral circuit region, and the intermediate region each include an electrically conductive member connected to the semiconductor layer to form the first and second plurality of contacts,
wherein an insulating film through which the electrically conductive members extends is provided in the pixel circuit region, the peripheral circuit region, and the intermediate region, the insulating film being positioned between the insulating layer and the semiconductor layer, and wherein an area occupancy rate of the electrically conductive member positioned in the second square section with respect to a total area of the second square section is from 0.5 to 1.5 times an area occupancy rate of the electrically conductive member positioned in the first square section with respect to a total area of the first square section.

16. The imaging device according to claim 14,
wherein a single electrically conductive layer is provided on the semiconductor layer in the pixel circuit region, the peripheral circuit region, and the intermediate region, the electrically conductive layer including wiring that connects the pixel circuit region and the peripheral circuit region to each other in the intermediate region, and
wherein an area occupancy rate of the electrically conductive layer positioned in the second square section with respect to a total area of the second square section is from 0.5 to 1.5 times an area occupancy rate of the electrically conductive layer in the second square section with respect to a total area of the pixel circuit region.

17. The imaging device according to claim 14,
wherein an electrically conductive layer is provided on the semiconductor layer in the pixel circuit region, the peripheral circuit region, and the intermediate region, the electrically conductive layer including wiring that connects the pixel circuit region and the peripheral circuit region to each other in the intermediate region, and the electrically conductive layer is positioned in the first square section and the second square section, a coincidence rate between patterns of the electrically conductive layer in the first square section and the second square section is equal to or more than 50%.

18. The imaging device according to claim 14, wherein each of the dielectric members in the pixel circuit region is overlapped with a corresponding one of the photoelectric conversion portions in the direction, and wherein at least one of dielectric members in the intermediate region is overlapped with no photoelectric conversion portion in the direction.

19. The imaging device according to claim 14,
wherein the first plurality of contacts includes first contacts through which a constant potential is supplied to the semiconductor layer, wherein the second plurality of contacts includes second contacts through which the constant potential is supplied to the semiconductor layer, and
wherein a distance between closest two of the first contacts is smaller than a distance between closest two of the second contacts.

20. The imaging device according to claim 14, wherein the first plurality of contacts includes at least one contact through which a power supply potential is supplied to the semiconductor layer, and a length of the four sides is 50 μm.

* * * * *